United States Patent
Srinivasan et al.

(10) Patent No.: US 11,922,088 B2
(45) Date of Patent: Mar. 5, 2024

(54) SYSTEM AND METHOD FOR ALIGNING HINGED SCREENS

(71) Applicant: DELL PRODUCTS L.P., Round Rock, TX (US)

(72) Inventors: Preeth K. Srinivasan, Round Rock, TX (US); Jace W. Files, Round Rock, TX (US); John Trevor Morrison, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 18/087,321

(22) Filed: Dec. 22, 2022

(65) Prior Publication Data

US 2023/0127857 A1  Apr. 27, 2023

Related U.S. Application Data

(62) Division of application No. 16/260,823, filed on Jan. 29, 2019, now Pat. No. 11,586,408.

(51) Int. Cl.
*G06F 3/14* (2006.01)
*H05K 5/00* (2006.01)
*H05K 5/02* (2006.01)

(52) U.S. Cl.
CPC .......... *G06F 3/1423* (2013.01); *G06F 3/1431* (2013.01); *G06F 3/1446* (2013.01); *H05K 5/0017* (2013.01); *H05K 5/0021* (2013.01); *H05K 5/0226* (2013.01); *G09G 2300/026* (2013.01); *G09G 2360/04* (2013.01); *G09G 2380/02* (2013.01)

(58) Field of Classification Search
CPC .... G06F 3/1423; G06F 3/1431; G06F 3/1446; H05K 5/0017; H05K 5/0021; H05K 5/0226; G09G 2300/026; G09G 2360/04; G09G 2380/02
See application file for complete search history.

(56) References Cited

U.S. PATENT DOCUMENTS

| | | | |
|---|---|---|---|
| 6,471,355 B1 | 10/2002 | Monson et al. | |
| 9,626,589 B1 | 4/2017 | Graham et al. | |
| 11,169,653 B2 * | 11/2021 | Aurongzeb | G06F 1/1675 |
| 2005/0093868 A1 | 5/2005 | Hinckley | |
| 2005/0201608 A1 | 9/2005 | Umeki et al. | |
| 2009/0016580 A1 | 1/2009 | Yamamichi et al. | |
| 2013/0076595 A1 | 3/2013 | Sirpal et al. | |
| 2013/0321340 A1 | 12/2013 | Seo et al. | |
| 2014/0009877 A1 | 1/2014 | Okamoto et al. | |
| 2014/0378183 A1 * | 12/2014 | Xiong | G06F 1/1647 455/566 |
| 2016/0321730 A1 | 11/2016 | Yonaha | |
| 2018/0054465 A1 | 2/2018 | Karacas et al. | |
| 2020/0073617 A1 | 3/2020 | Huang et al. | |

* cited by examiner

*Primary Examiner* — Kwang-Su Yang
(74) *Attorney, Agent, or Firm* — Larson Newman, LLP

(57) ABSTRACT

An information handling system includes adjacent displays connected by a hinge. A processor renders a first image on the first display, renders a second image on the second display, and receives data representing a misalignment between the first display and the second display. The data is implemented to compensate for the misalignment between the first display and the second display.

20 Claims, 20 Drawing Sheets

SYSTEM AND METHOD FOR ALIGNING HINGED SCREENS

CROSS-REFERENCE TO RELATED APPLICATION

This application is a Division of U.S. patent application Ser. No. 16/260,823 entitled "System and Method for Aligning Hinged Screens," filed Jan. 29, 2019, the disclosure of which is hereby expressly incorporated by reference in its entirety.

FIELD OF THE DISCLOSURE

The present disclosure generally relates to information handling systems, and more particularly relates to aligning hinged screens.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system with adjacent hinged displays may become misaligned. Images of the adjacent displays, such as screen shots, may be generated and compared to a reference image to determine a misalignment between the adjacent displays. Database lookups may be used to identify a compensation that has been predetermined for known values of the misalignment. The compensation may then be implemented to correct the misalignment. A processor, for example, may be instructed to vertically, horizontally, and/or rotationally shift either or both of the images.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
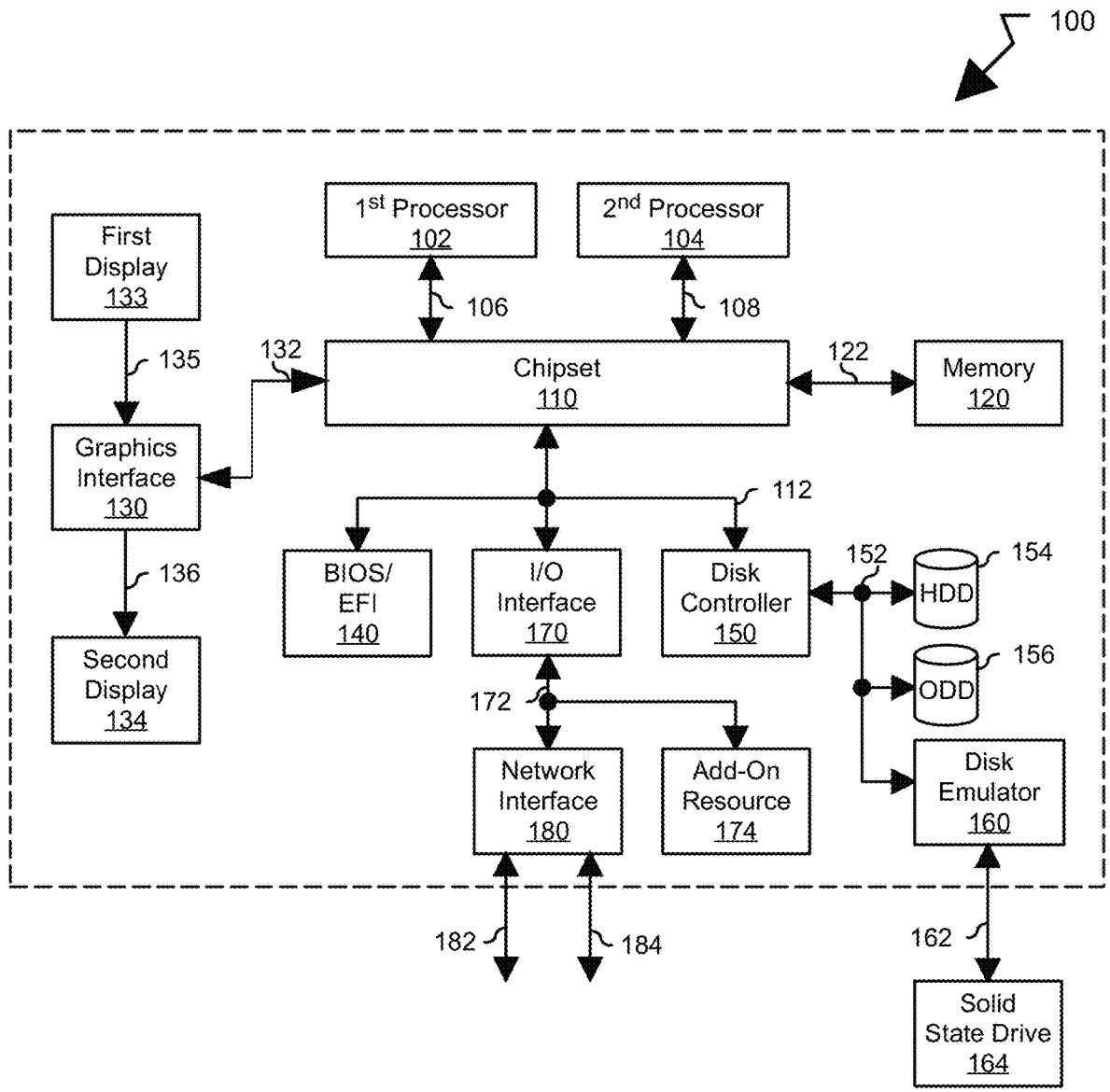
FIG. 1 is a block diagram that illustrates an information handling system according to an embodiment of the present disclosure.

FIG. 1 illustrates a generalized embodiment of information handling system 100, such as a dual visual surface system. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics processor 132, and provides multiple visual outputs or signals to multiple displays. While the information handling system 100 may have any number of displays, FIG. 1 illustrates a simple example of two displays 133 and 134. The graphics processor 132 sends visual outputs 135 to the first display 133, and the graphics processor 132 sends different visual outputs 136 to the second display 134. The displays 133 and 134 may be capacitive touch screen displays. The displays 133 and 134, though, may utilize or incorporate any input and/or display technology. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Figure 2:
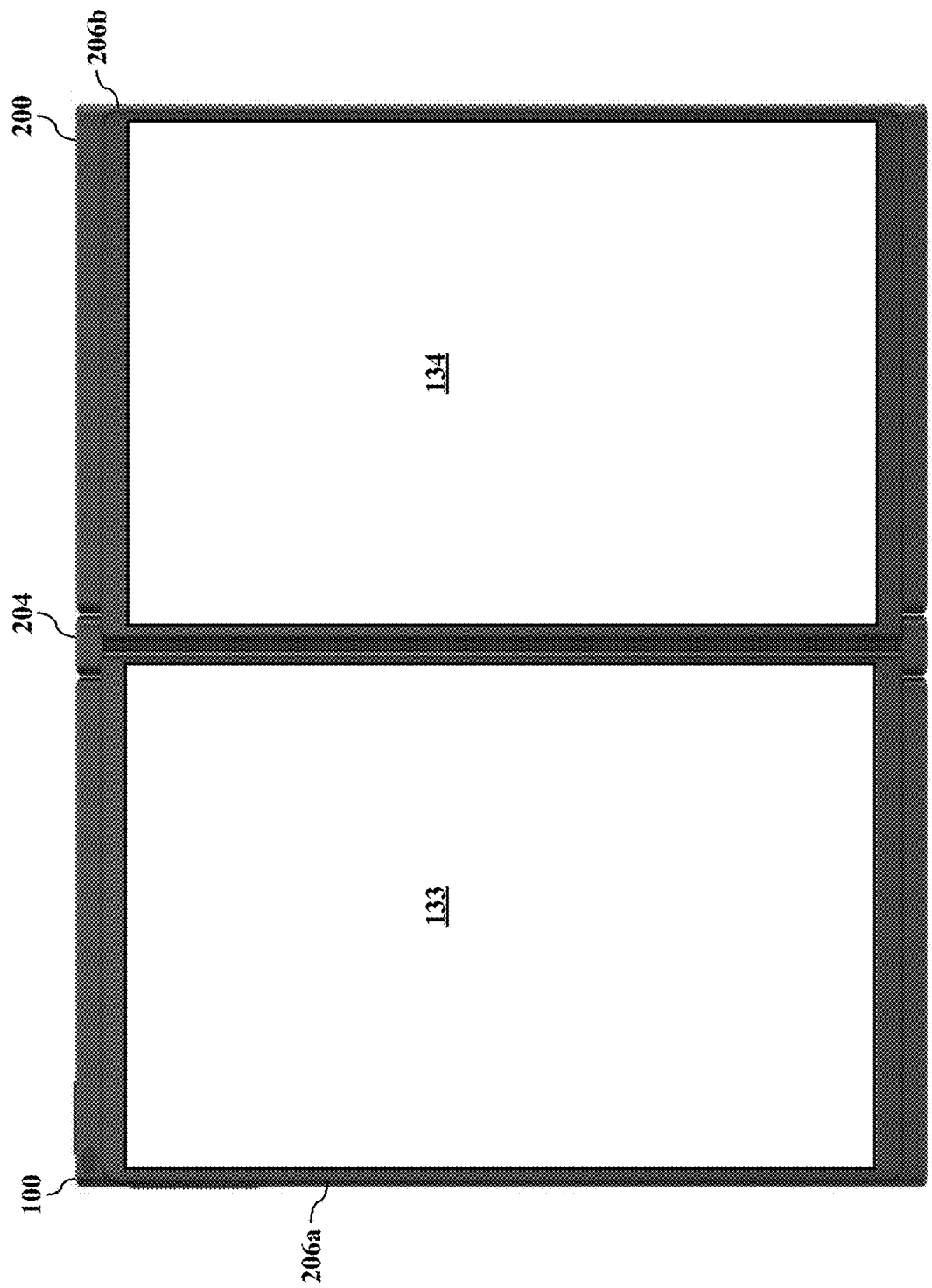
FIGS. 2 and 3 illustrate devices having multiple displays, according to exemplary embodiments.
Figure 3:
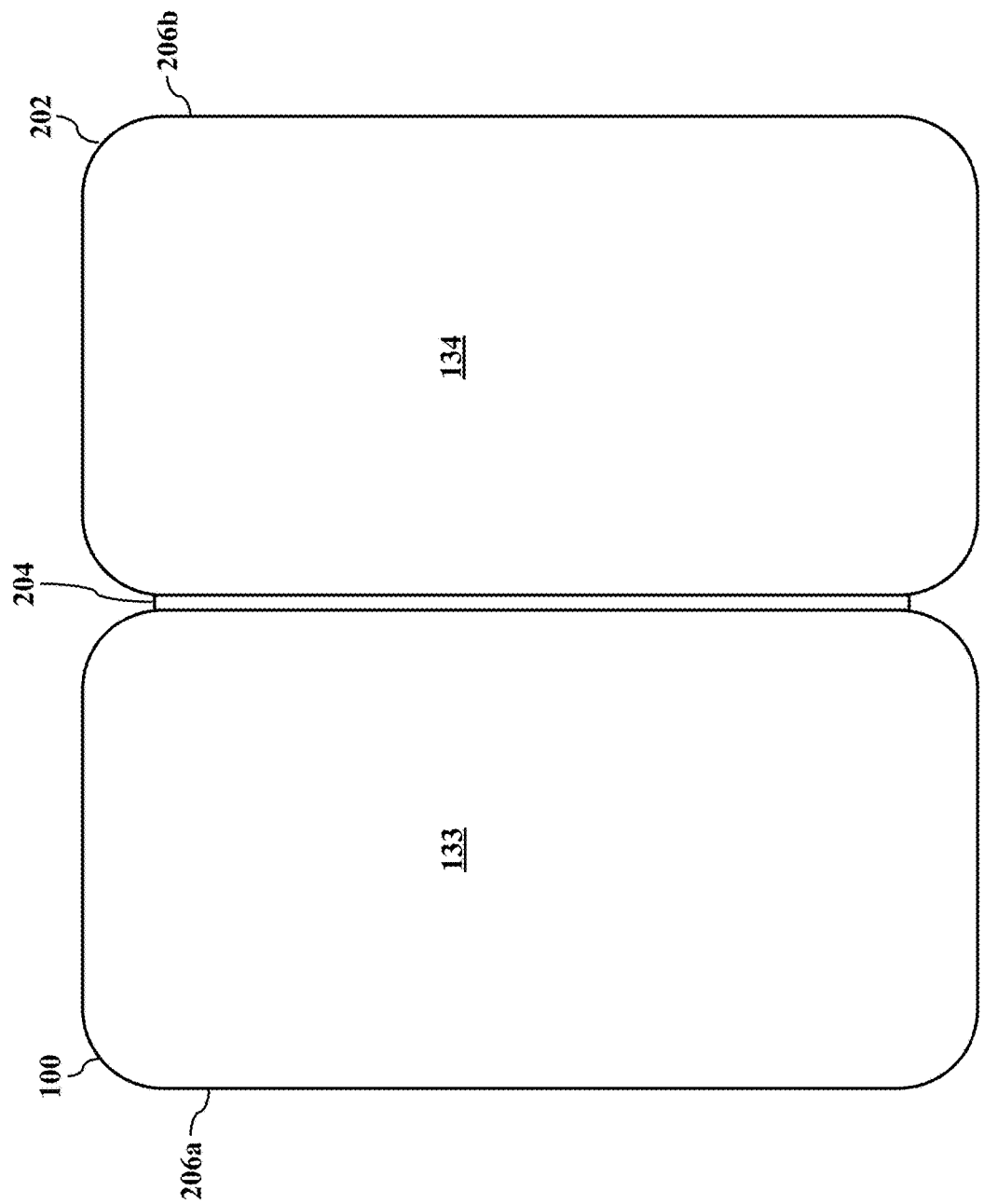

FIG. 2 shows an information handling system such as an electronic book 200, while FIG. 3 illustrates the information handling system as a mobile device such as a cellular smartphone 202. Both embodiments 200 and 202 have a hinge 204 with interleaving members or leaves (not shown for simplicity) that mechanically interconnects housings 206a and 206b that, respectively, incorporate and expose the displays 133 and 134. The hinge 204 allows a human user to open and to close the displays 133 and 134, similar to a conventional paper book.

FIGS. 4-7 illustrate various misalignments 210 that may occur between the displays 133 and 134. When the information handling system 100 (such as the mobile smartphone 202) incorporates the displays 133 and 134, their respective display images 212a and 212b may be misaligned. The misalignment 210 may be small or minimal and, generally, of little or no consequence. However, greater misalignments 210 may produce a displeasing visual effect.

Figure 4:
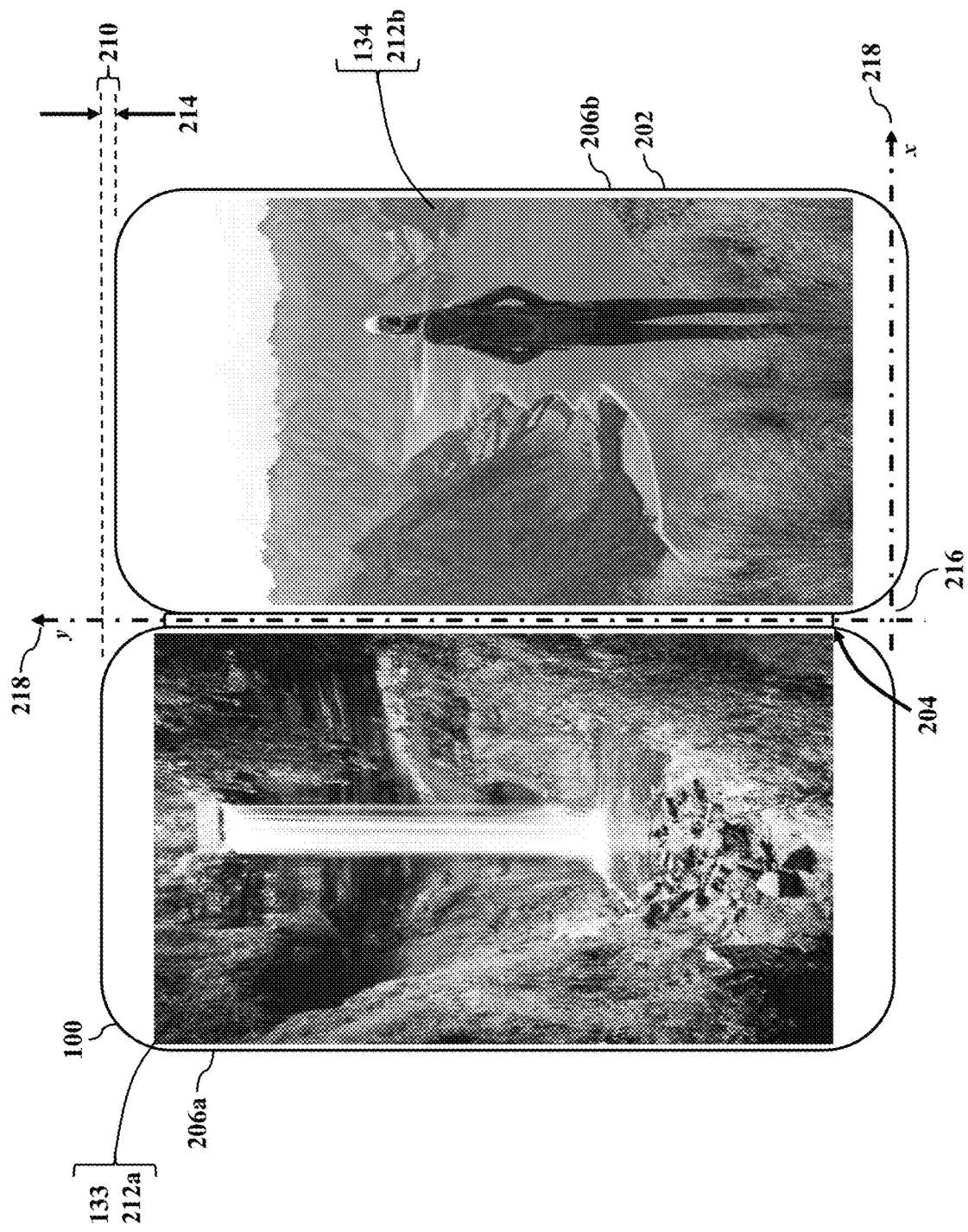
FIGS. 4-7 illustrate various misalignments that may occur between the multiple displays.

For example, FIG. 4 illustrates a vertical offset 214 between the display images 212a and 212b. The vertical offset 214 may occur in a y-direction (with respect to an origin 216 of an x-y Cartesian coordinate system 218). The two displays 133 and 134 may be physically misaligned or offset during manufacture. For example, during manufacture, mechanical tolerances in the hinge 204 and/or in the housings 206a and 206b may stack to cause the misalignment 210 between the displays 133 and 134. Moreover, the displays 133 and 134 may be misaligned within their respective housings 206a and 206b, thus perhaps cropping portions of the display images 212a and 212b and contributing to the misalignment 210. As the hinge 204 is repeatedly pivoted during use (for example opened and closed), the hinge 204 wears and/or warps, thus contributing to the misalignment 210. In instances where a single image is rendered across both displays, a problem can occur where neighboring pixels of the adjacent displays are misaligned or offset. A pixel misalignment can cause a first part of a line of text, or a first part of a row of a spreadsheet or database, to appear offset from a second part of the line of text, or a second part of the row of the spreadsheet or database. The pixel misalignment can develop during assembly, such as when manufacturing tolerances in the components accumulate. The pixel misalignment can also develop during use of information handling system 200, such as due to warpage of or physical impact to the components. Any misalignment can become more noticeable as a width of a physical gap between the first and second displays becomes smaller, or as the resolution of the displays increases.

Figure 5:
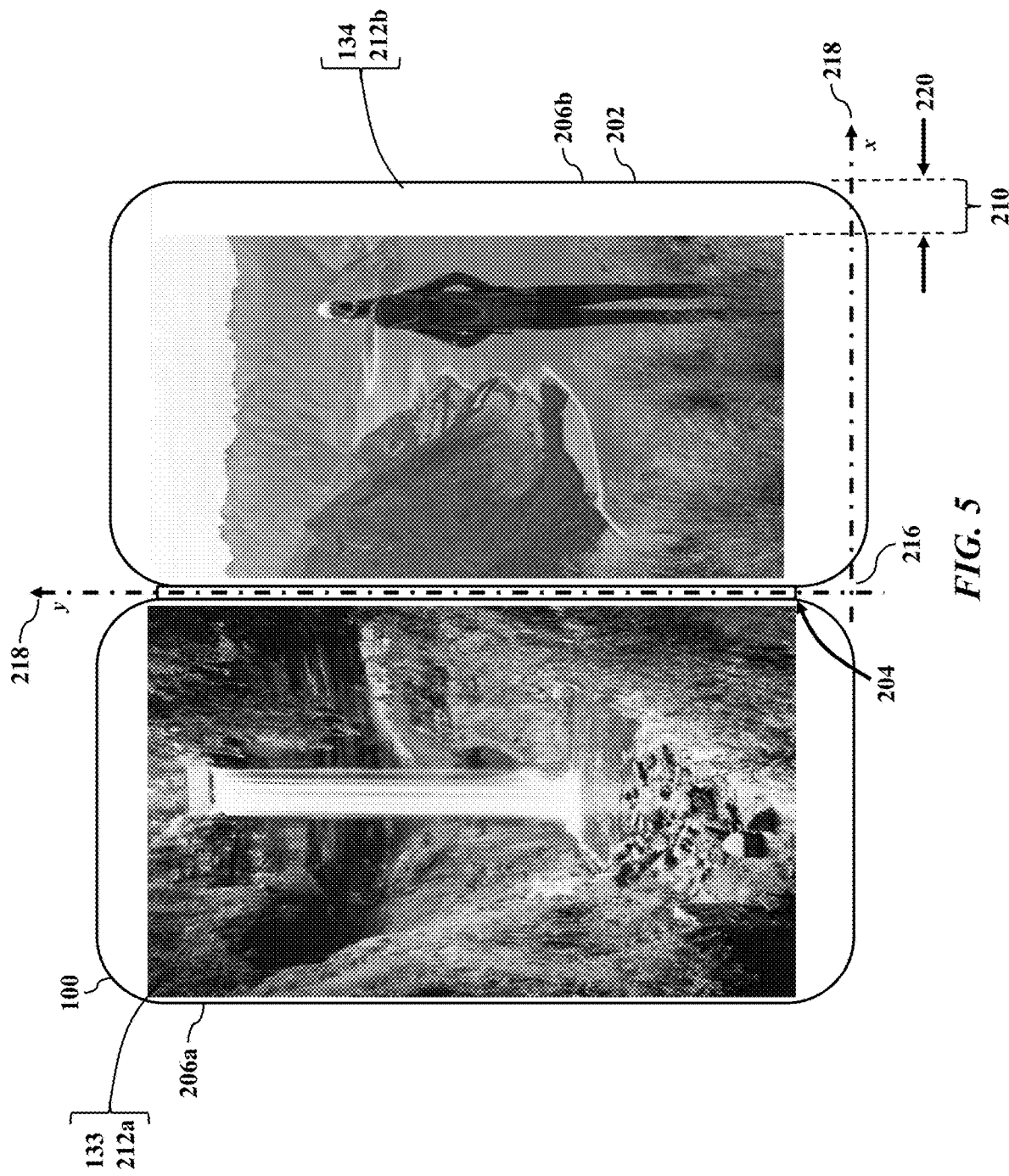
Figure 6:
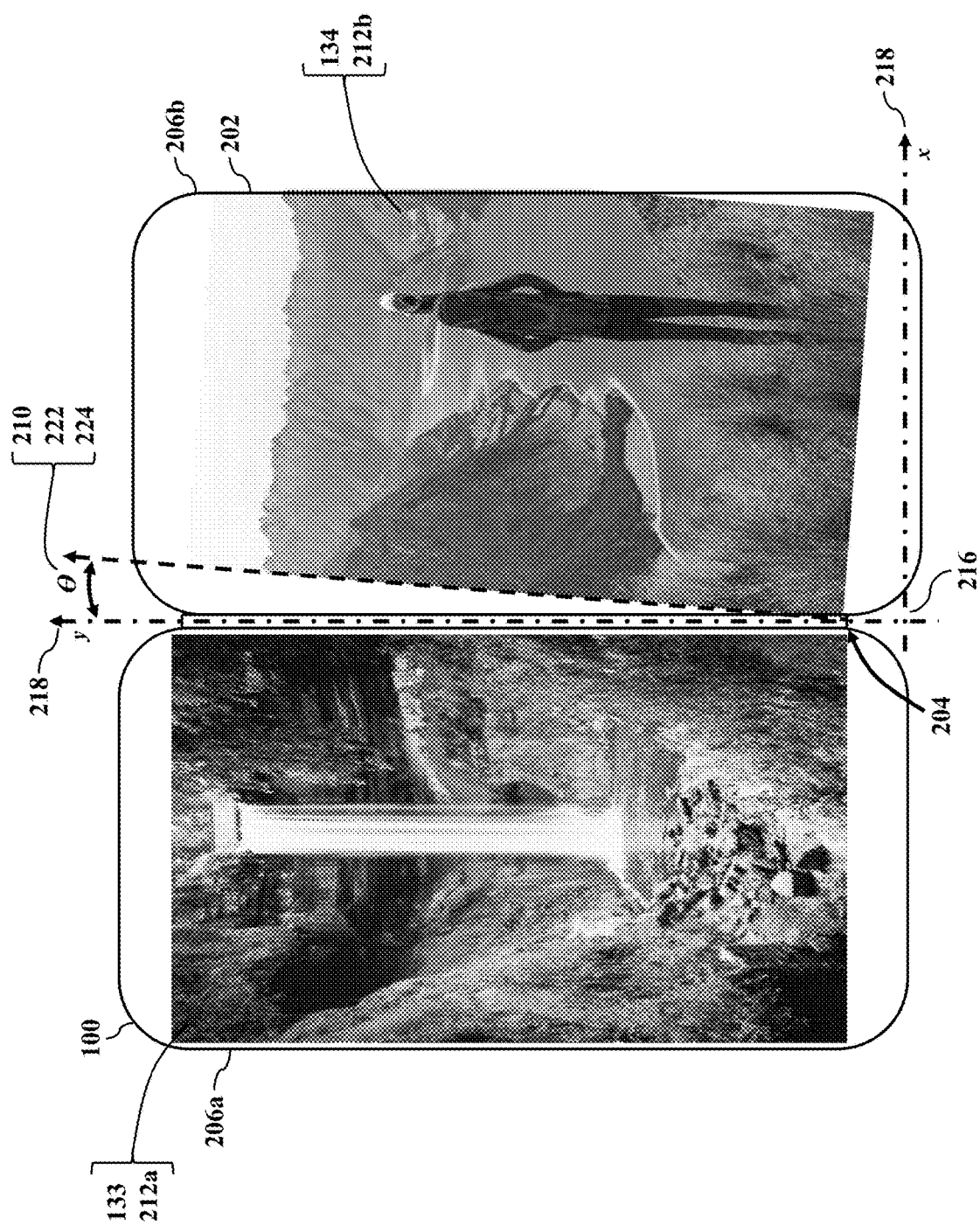

FIGS. 5-6 illustrate additional misalignments 210. FIG. 5 illustrates a horizontal offset 220 in an x-direction (with respect to the origin 216 of the x-y Cartesian coordinate system 218). The horizontal offset 220 may result in a cropage of a portion of either or both of the display 212a and 212b. FIG. 6 illustrates a rotational misalignment 222 between the display images 212a and 212b. The rotational misalignment 222 is illustrated as an angle θ (illustrated as reference numeral 224) about the origin 216 of the x-y Cartesian coordinate system 218. The rotational misalignment 222 may thus be a twist or skew of either or both of the display images 212a and 212b about the origin 216 of the x-y Cartesian coordinate system 218.

Figure 7:
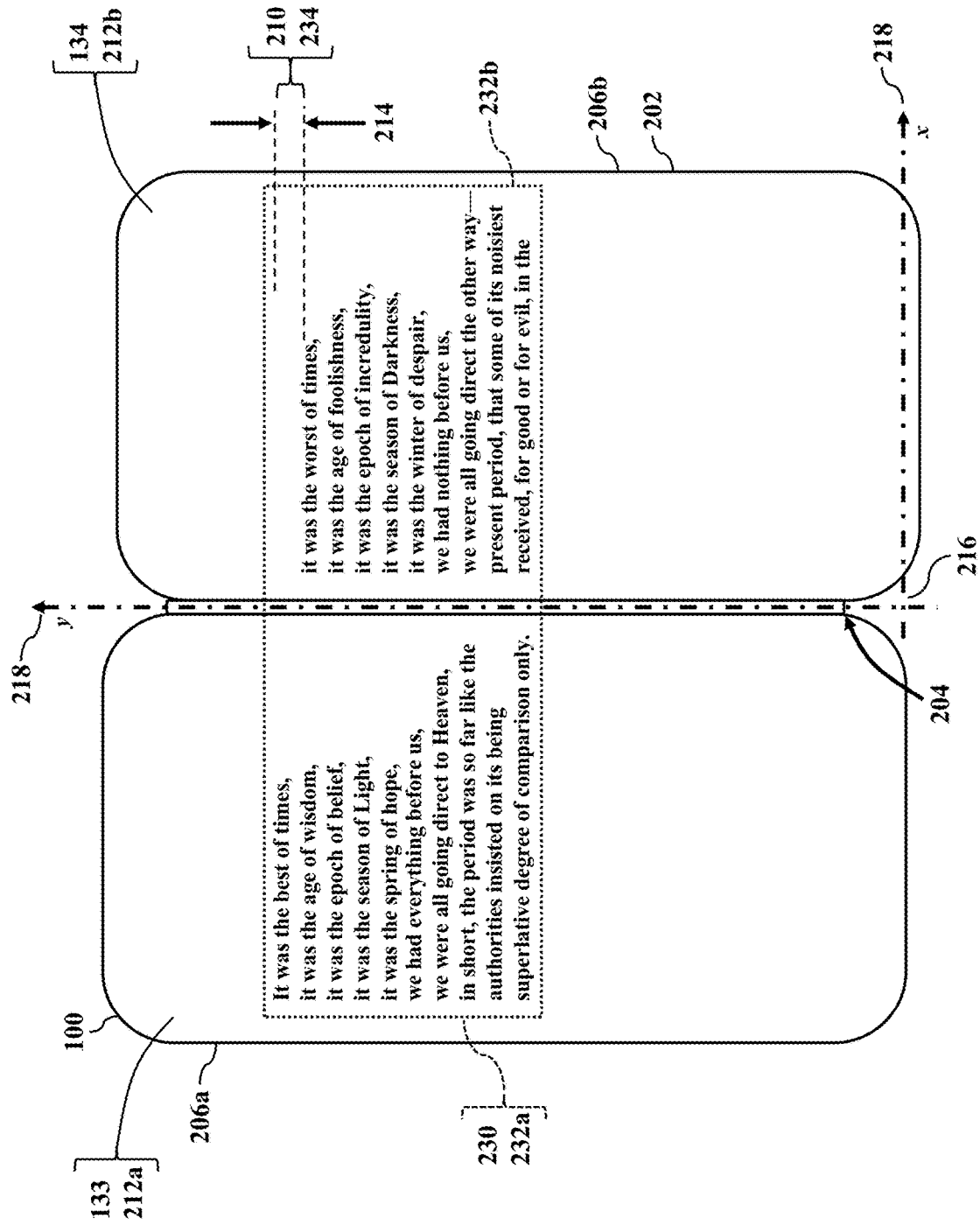

FIG. 7 further illustrates the misalignment 210. Even though the displays 133 and 134 may be misaligned, the visual effect may be minimal. However, the misalignment 210 may be large enough to produce a visually displeasing effect. Suppose the display images 212a and 212b are complementary to produce a single, composite or combined image 230 that is displayed across the two displays 133 and 134. FIG. 7 illustrates the image 230 as text 232 that spans or continues across the left and right displays 133 and 134. The hinge 204 thus interrupts the linear text 232a (displayed by the display device 133) that continues with the linear text 232b (displayed by the display device 134). The text 232a and 232b crossing the hinge 204 may be misaligned or offset, resulting in a pixel misalignment 234. That is, neighboring pixels of the adjacent displays 133 and 134 may be misaligned or offset. The pixel misalignment 234 can cause a first part of a line of the text 232a (or a first part of a row of a spreadsheet or database) to appear offset from a second part of the line of text 232b (or a second part of the row of the spreadsheet or database). The pixel misalignment 234 may even become more noticeable as a width of a physical gap between the first display 133 and the second display 134 becomes smaller, or as the resolution of the displays 133 and 134 increases.

Figure 8:
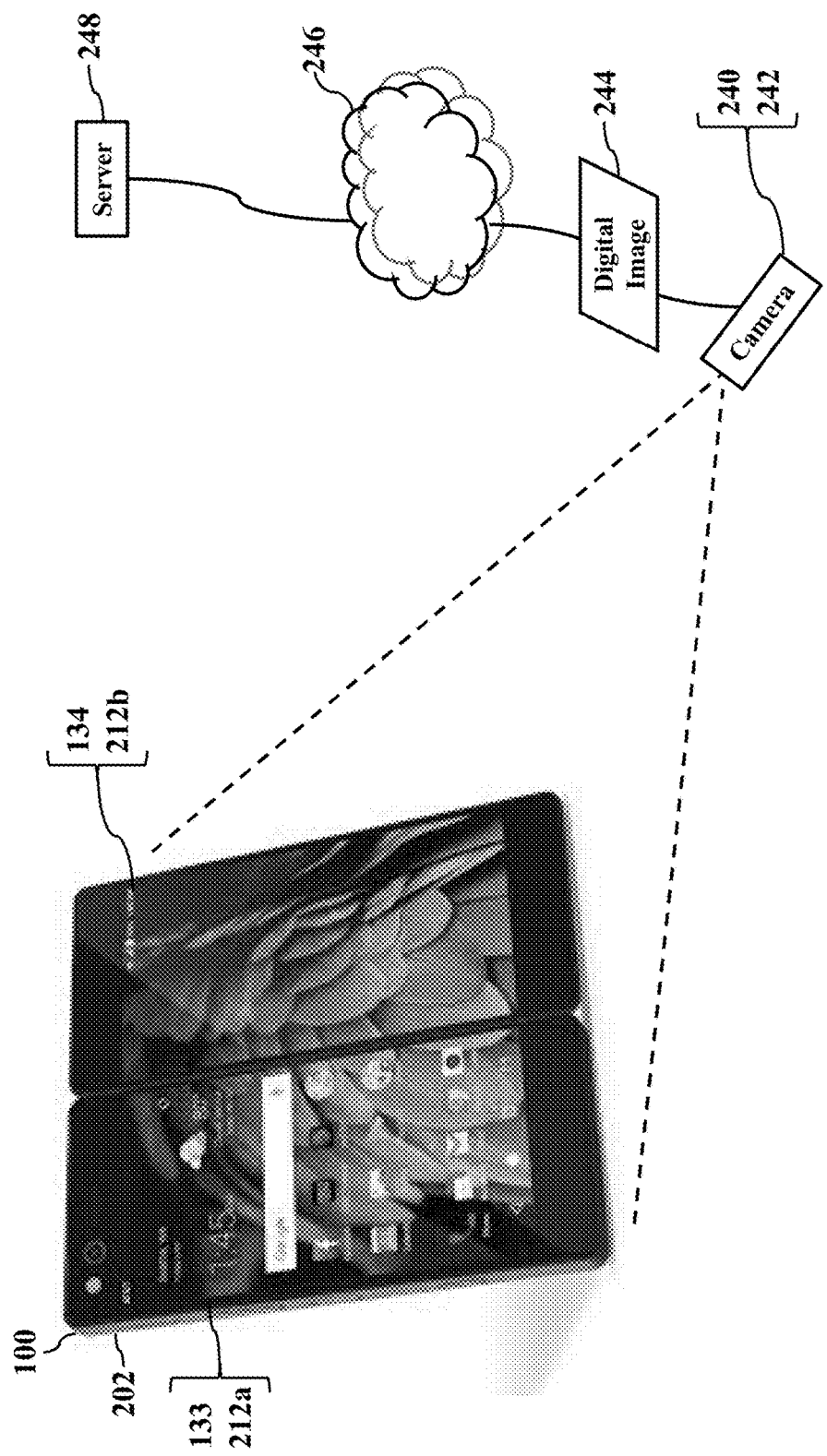
FIGS. 8-12 illustrate software compensation, according to exemplary embodiments.
Figure 9:
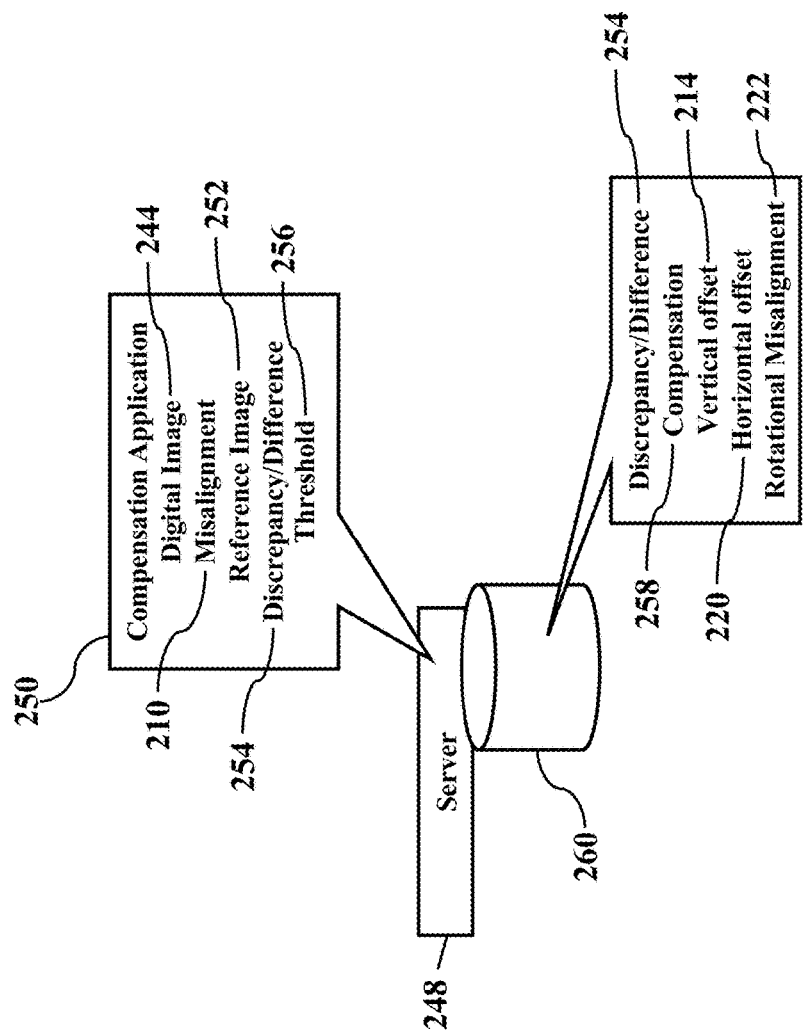
Figure 10:
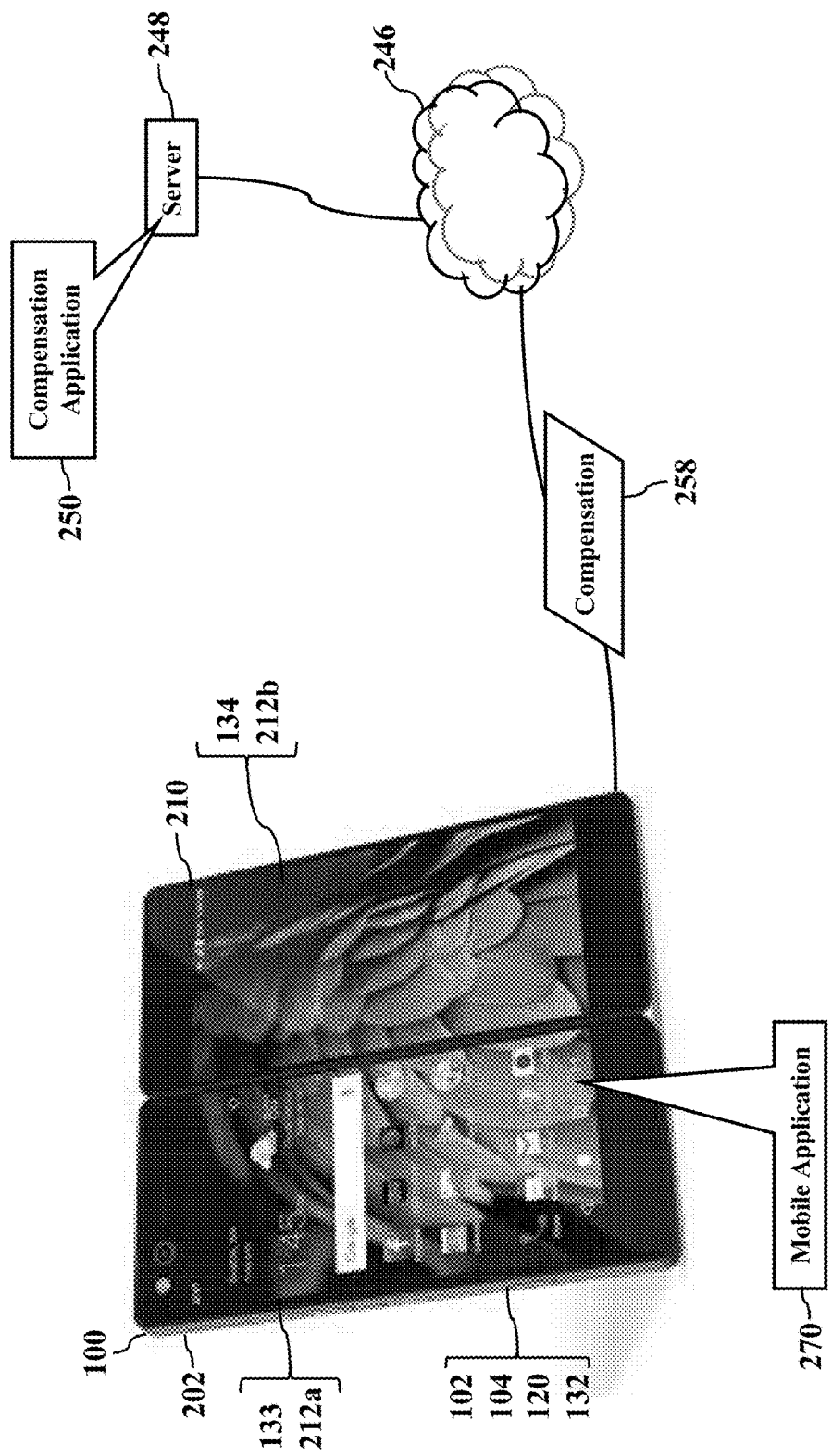

FIGS. 8-10 are illustrations of software compensation, according to exemplary embodiments. A vision system 240 monitors the images 212a and 212b respectively rendered by the displays 133 and 134. That is, while the images 212a and 212b are respectively generated by the displays 133 and 134, a camera 242 captures a digital image 244. The digital image 244 has information or data representing one, or both, of the images 212a and 212b respectively displayed by the displays 133 and 134. The camera 242 has an internal hardware processor, solid-state memory device, and network interface (not shown for simplicity) that sends or communicates the digital image 244 via a communications network 246 to another information handling system 100b (illustrated as a server 248).

FIG. 9 illustrates image processing. The server 248 inspects the digital image 244 upon receipt. The server 248 executes a compensation application 250 that causes the server to inspect the digital image 244 to infer the misalignment 210 between the displays 133 and 134 (illustrated in FIG. 8). The server 248 has the processors 102/104 (illustrated in FIG. 1) that execute the compensation application 250 stored in the solid-state memory device 120 (also illustrated in FIG. 1). The compensation application 250 includes instructions or code that cause the processors 102/104 to perform operations, such as comparing the digital image 244 to a reference image 252. The reference image 252 contains pixel data or information representing a template, pattern, or other acceptable measure or specification of alignment. Any pixel discrepancy or difference 254 between the reference image 252 and the digital image 244 may then be compared to a threshold difference 256. If the pixel discrepancy or difference 254 is less than the threshold difference 256, then perhaps a correction or compensation 258 is not needed. That is, the reference image 252 and the digital image 244 sufficiently match and the compensation application 250 infers that the displays 133 and 134 are adequately aligned. However, when the pixel discrepancy or difference 254 is equal to or greater than the threshold difference 256, the compensation application 250 infers that the displays 133 and 134 exhibit the misalignment 210. An error, in other words, may be inferred or flagged.

The compensation 258 may be predetermined. When the pixel discrepancy or difference 254 is equal to or exceeds the threshold difference 256, the compensation application 250 may determine the compensation 258 to correct for the misalignment 210 between the displays 133 and 134. The compensation application 250, for example, causes or instructs the server 248 to consult a compensation database 260. FIG. 9 illustrates the compensation database 260 locally stored in the server 248, but the compensation database 260 may be remotely stored and accessed via the communications network 246 (illustrated in FIG. 8). Regardless, the compensation database 260 has entries that electronically relate different pixel discrepancies or differences 254 to their corresponding compensations 250. The compensation database 260 may thus be populated with predetermined corrections 250 for known values of the pixel discrepancies or differences 254. The compensation database 260, for example, may have tabular rows and columns with entries that associate different values and/or combinations of the vertical offset 214, the horizontal offset 220, and/or the rotational misalignment 222 to their corresponding compensations 258. The server 248 queries the compensation database 260 for the pixel discrepancy or difference 254, and the compensation database 260 acts as a query handler that looks up the corresponding compensation 258.

FIG. 10 illustrates implementation. Once the server 248 determines the compensation 258, the server 248 may then send the compensation 258 as a message or data via the communications network 246 to the information handling system 100 (again illustrated as the mobile smartphone 202 incorporating the two displays 133 and 134). When the information handling system 100 receives the compensation 258, the information handling system 100 implements the compensation 258 as a correction for the misalignment 210 between the displays 133 and 134. Recall that the mobile smartphone 202 has the processors 102/104 and the solid-state memory device 120. The processors 102/104 execute the mobile application 270 stored in the solid-state memory device 120. The mobile application 270 includes instructions or code that cause the processors 102/104 to perform operations, such as instructing the graphics processor 132 to implement the compensation 258 as a correction for the misalignment 210 between the displays 133 and 134. The compensation application 250 and the mobile application 270 may thus cooperate, perhaps in a client-server architecture or relationship, to determine and implement the compensation 258.

Figure 11:
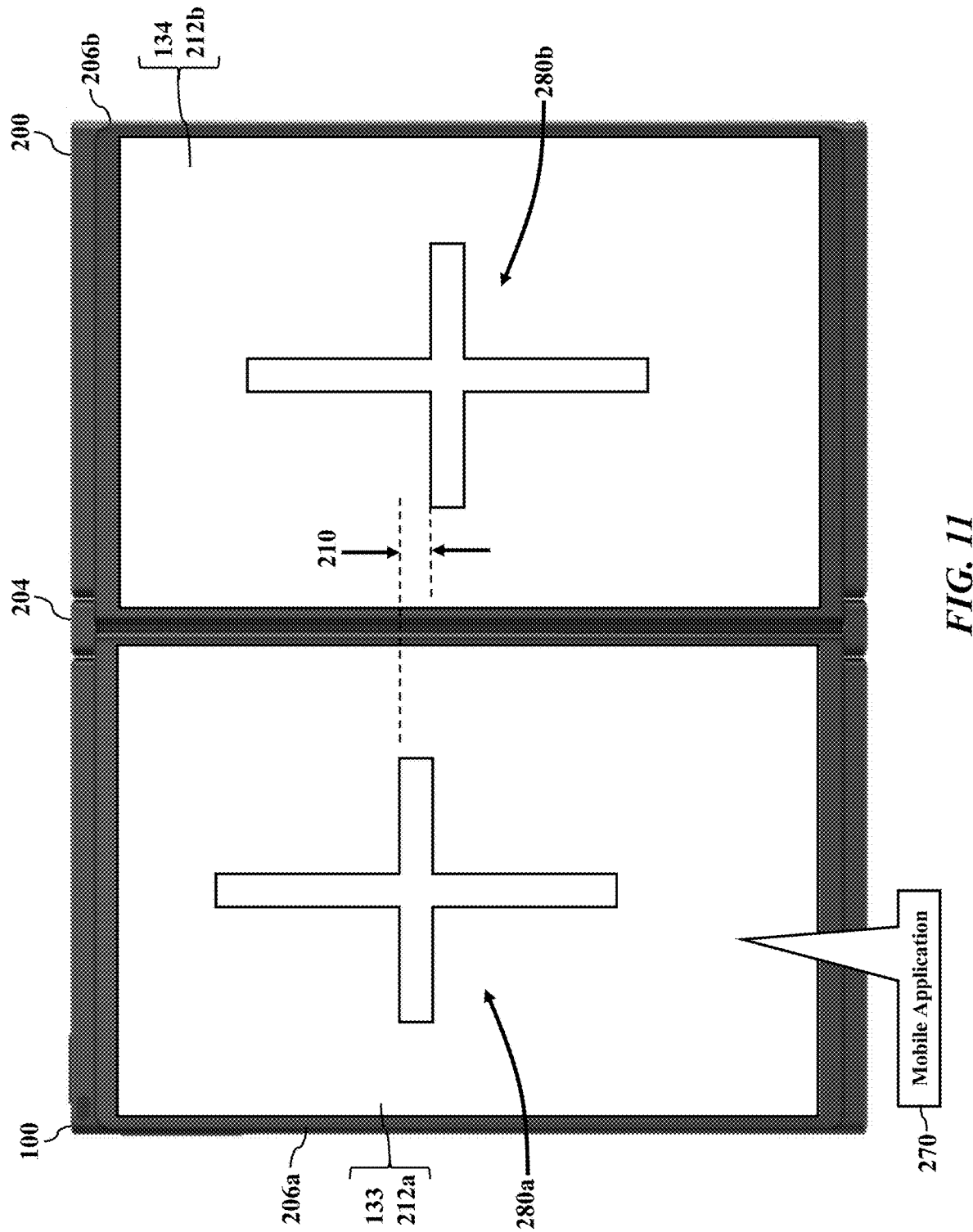

FIG. 11 further illustrates the software compensation, according to exemplary embodiments. Here the mobile application 270 may instruct or cause the electronic book 200 to display predetermined test images when testing for the misalignment 210 between the displays 133 and 134. The information handling system 100, for example, retrieves a first test image 280a and a second test image 280b. FIG. 11 illustrates the test images 280a and 280b being locally stored in the electronic book 200, but the test images 280a and 280b may be remotely retrieved from any networked location or node (such as the server 248, as above explained with reference to FIGS. 8-10). Regardless, the mobile application 270 instructs the electronic book 200 to process the first or left test image 280a for a display by the first or left display device 133. The mobile application 270 also instructs the electronic book 200 to process the second or right test image 280b for a display by the second or right display device 134. The first test image 280a and the second test image 280b may the same image file or different image files. While the test images 280a and 280b may have any informational or data content (such as still, static, or video), FIG. 11 illustrates calibration plus or cruciform images. Moreover, the test images 280a and 280b may cause visible light to be emitted from the displays 133 and 134 (such as any target grid, pattern, or shape). The test images 280a and 280b, however, may additionally or alternatively cause infrared light to be emitted from the displays 133 and 134. Returning to FIGS. 8-10, the camera 242 of the vision system 240 captures and sends the digital image 244 via the communications network 246 to the server 248 for analysis (as above explained). The server 248 compares the digital image 244 to the reference image 252 to infer the misalignment 210 (e.g., the pixel discrepancy or difference 254 and its corresponding compensation 258, as above explained). The server 248 sends the compensation 258 to the information handling system 100 for implementation by the graphics processor 132 (as above explained).

Figure 12:
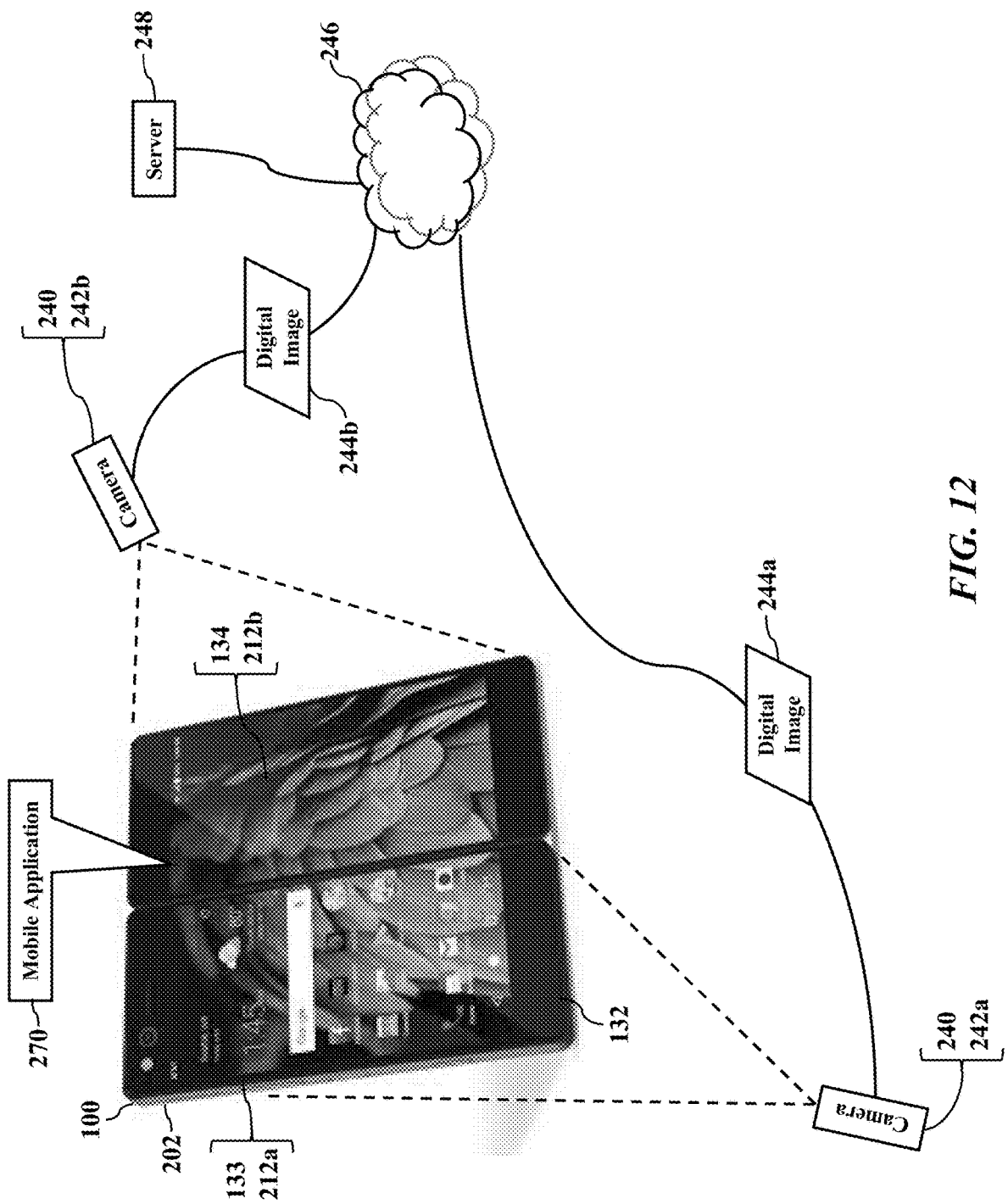

FIG. 12 further illustrates the software compensation, according to exemplary embodiments. Here the vision system 240 has two digital cameras 242a and 242b. The digital cameras 242a and 242b respectively capture the digital images 212a and 212b of the displays 133 and 134. The first or left digital camera 242a, for example, captures the digital image 244a representing a visual and/or infrared output generated by the first or left display device 133. The second or right digital camera 242b captures the digital image 212b representing a visual and/or infrared output generated by the second or right display device 134. (The displays 133 and 134 may additionally or alternatively output the test images 280a and 280b, as above explained). The information handling system 100 sends the digital images 212a and 212b via the communications network 246 to the server 248 for analysis (as above explained). Returning to FIGS. 9-10, the server 248 compares the digital images 212a and 212b to themselves and/or to the reference image 252 to determine the pixel discrepancy or difference 254 and its corresponding compensation 258 (as above explained). The server 248 sends the compensation 258 to the information handling system 100 (illustrated as the mobile smartphone 202) for implementation by the graphics processor 132 (as above explained).

The information handling system 100 (whether the electronic book 200 or the mobile smartphone 202) may thus be instructed to display known or predetermined images. Calibration may thus be performed while displaying a template of horizontal and vertical patterns, such as during a manufacturing step or a service call. The compensation database 260 may be preloaded with different combinations of values representing the vertical offset 214, the horizontal offset 220, and/or the rotational misalignment 210 and the corresponding compensation 258. The graphics processor 132 (such as a system graphics controller) may thus be instructed to execute the compensation for horizontal, longitudinal, and/or rotational correction of one or both displays 133 and 134 to reduce loss of overall pixels. Consequently, there may be an overall loss of pixels to the tune of half of the error factor on either display 133 and/or 134.

Figure 13:
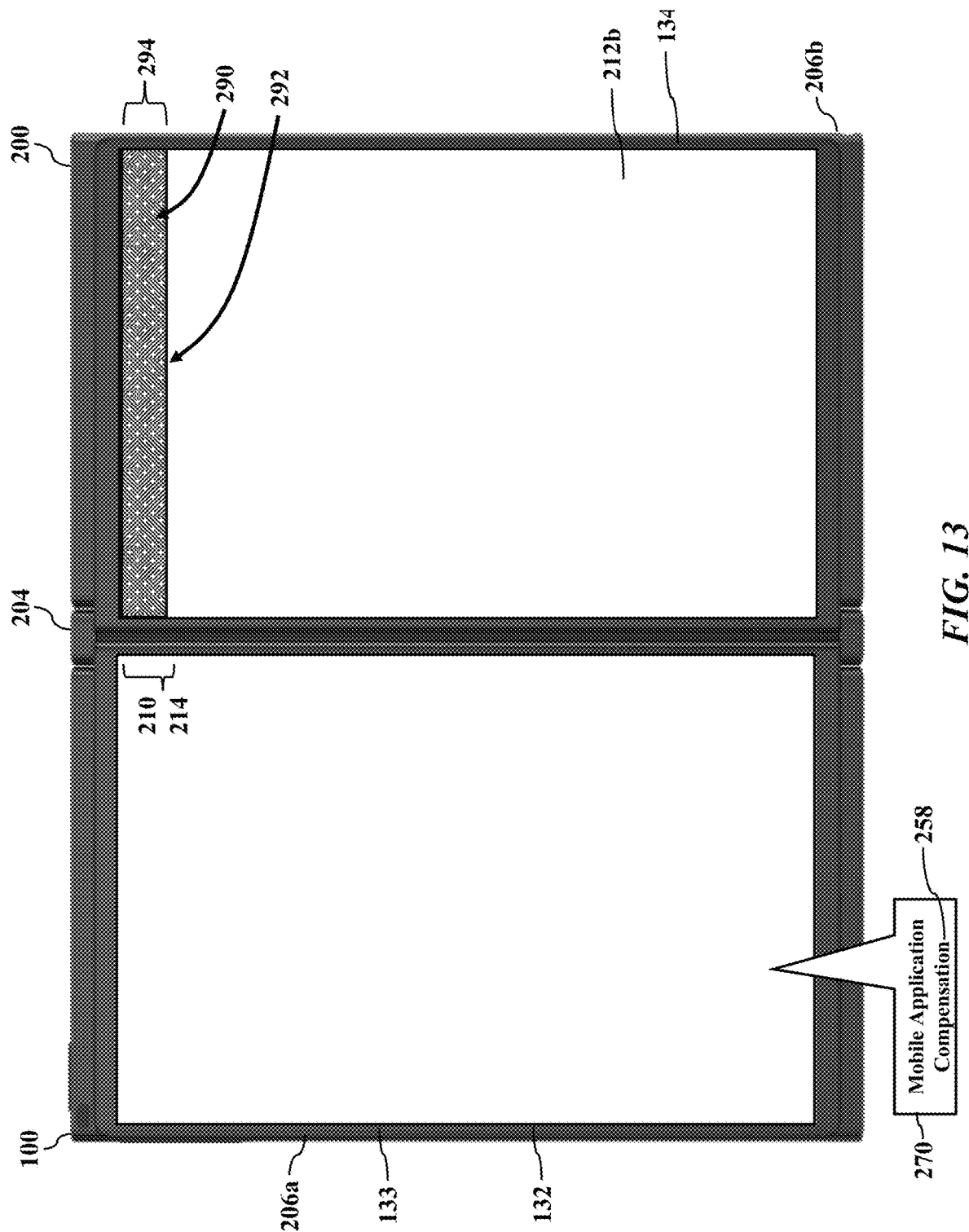
FIGS. 13-16 illustrate reserve pixels, according to exemplary embodiments.

FIGS. 13-16 illustrate reserve pixels 290, according to exemplary embodiments. The displays 133 and 134 are manufactured with a grid of millions, or even billions, of pixels 290. Each individual pixel 290 is an addressable and controllable picture element that emits different colors of light. For example, light emitting diodes (or LEDs) that are commonly used in modern televisions. Newer technologies include organic light emitting diodes (or OLEDs), which are now appearing in the marketplace. The actual pixel technology, though, is unimportant, and this disclosure is applicable to any pixel technology and/or manufacturing technique. Regardless, as FIG. 13 illustrates, one or both of the displays 133 and 134 may include the reserve pixels 290. The reserve pixels 290 are excess picture elements that may be assigned/controlled to compensate for the misalignment 210 between the displays 133 and 134. The reserve pixels 290, in other words, may be held in reserve and perhaps normally unused or inactive unless the misalignment 210 is determined.

FIG. 13 illustrates edge banding. When the displays 133 and 134 are manufactured, the excess pixels 290 may be additionally formed or masked to increase a pixel density of the displays 133 and 134. For example, the right or second display device 134 may be manufactured to have an increased resolution of 1930×1090, whereas a resolution of 1920×1080 may be conventional. The right or second display device 134, in other words, may have an additional ten (10) pixels per horizontal row and have an additional ten (10) pixels per vertical column. FIG. 13 thus illustrates the reserve pixels 290 manufactured along a top edge 292 of the display device 134. The reserve pixels 290 are thus a horizontal band 294 that is available for overcoming any vertical misalignment 210 between the displays 133 and 134. The horizontal band 294 of the reserve pixels 290 may thus be controlled and activated to upwardly shift the display image 212b (output by the display device 134). In other words, when the vertical offset 214 is determined, the graphics processor 132 may be commanded or instructed to implement the compensation 258 in the up/down or positive/negative y-direction. The mobile application 270 may thus cause the graphics processor 132 to utilize the reserve pixels 290 in the horizontal band 294 to reposition the display image 212b (output by the right display device 134).

Figure 14:
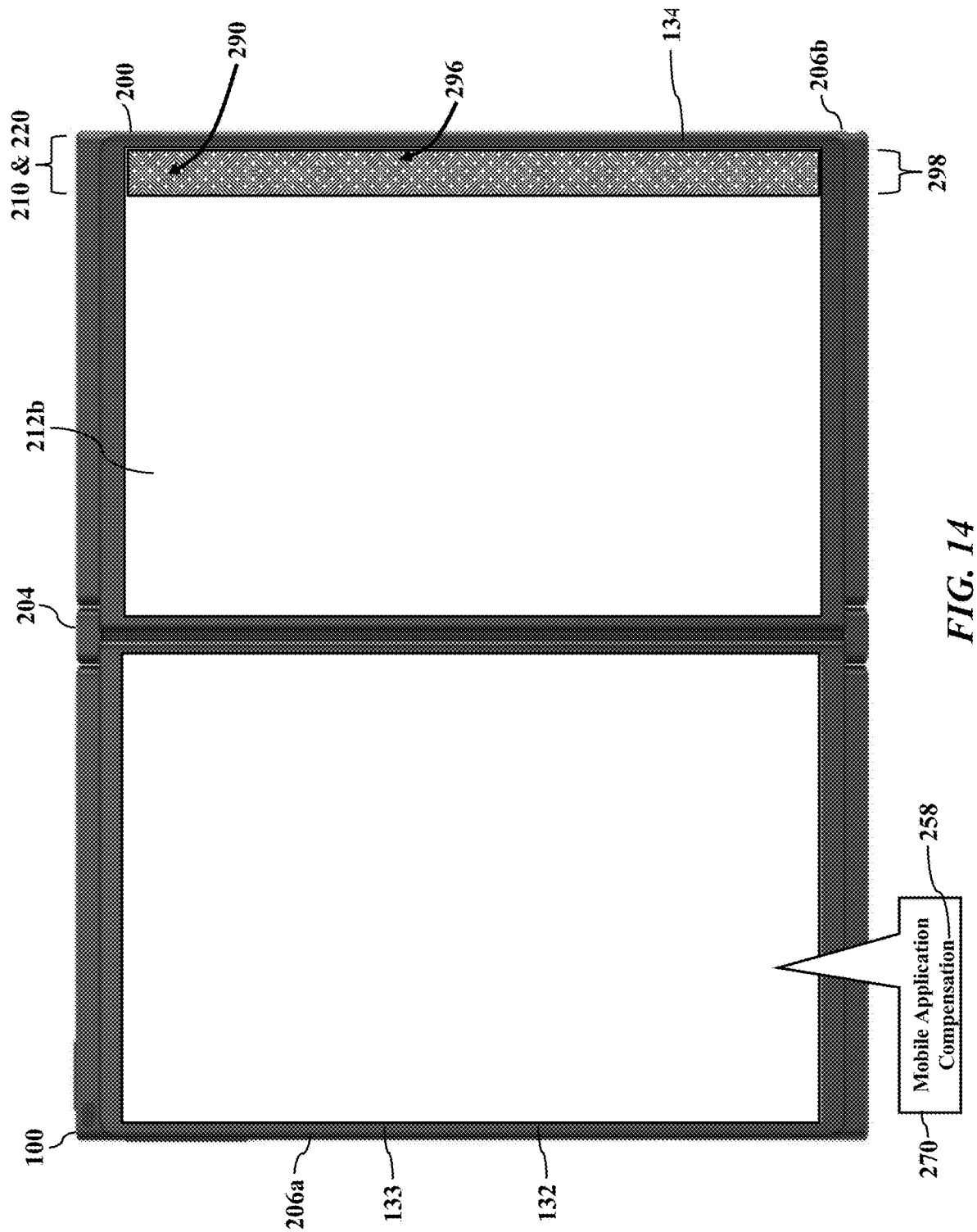

FIG. 14 further illustrates edge banding. Here, though, the reserve pixels 290 are manufactured along a right edge 296 of the right display device 134. The reserve pixels 290 are thus a vertical band 298 that is available for overcoming the horizontal misalignment 210 between the displays 133 and 134. The vertical band 298 of the reserve pixels 290 may thus be controlled and activated to side-shift the display image 212b (output by the display device 134). In other words, when the horizontal offset 220 is determined in the x-direction (as above explained), the graphics processor 132 may be commanded or instructed to implement the compensation 258 in the left/right or positive/negative x-direction. The mobile application 270 may thus command the graphics processor 132 to utilize the reserve pixels 290 in the horizontal band 294 to reposition the display image 212b (output by the right display device 134).

Figure 15:
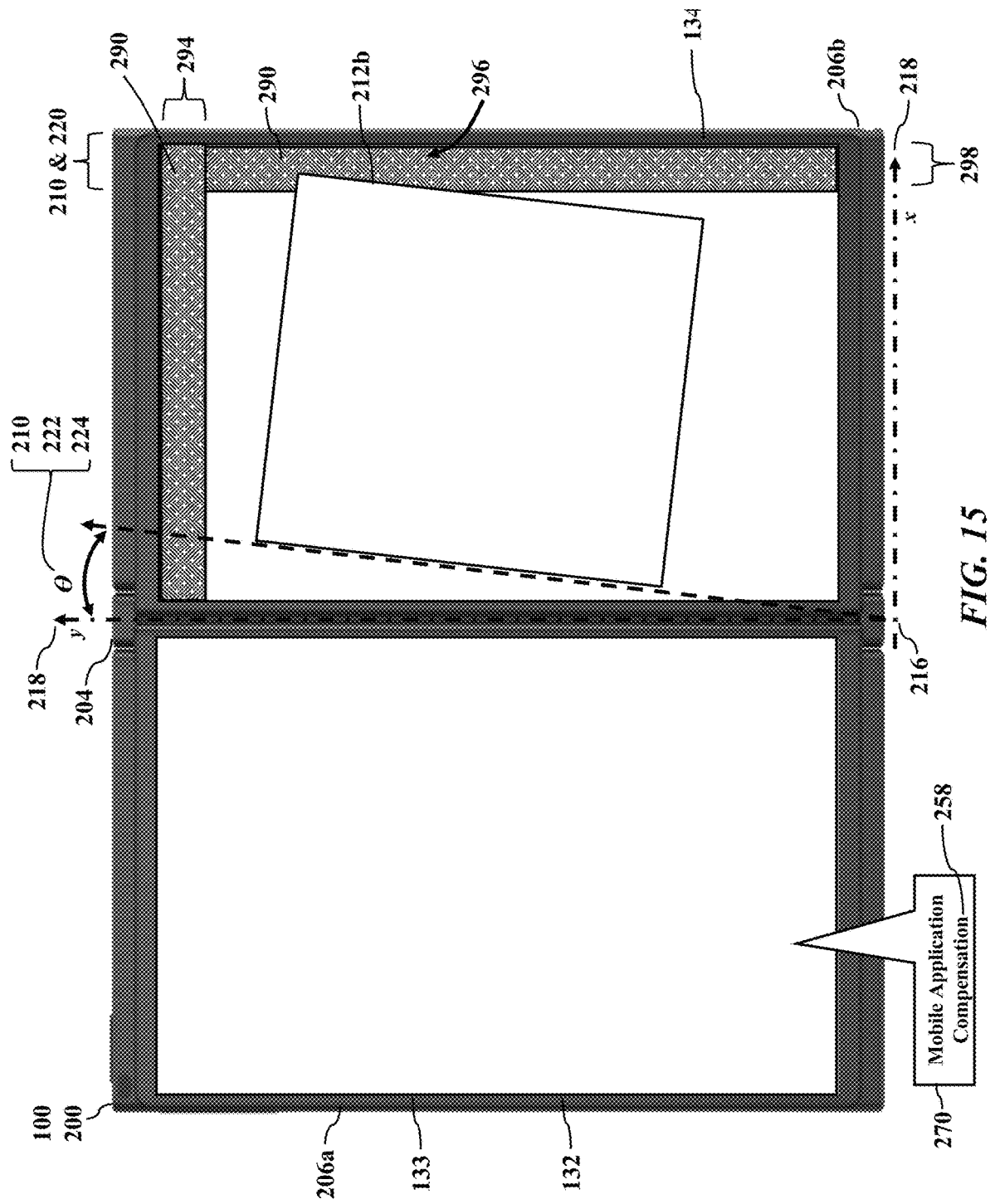

FIG. 15 further illustrates edge banding. Here, though, the reserve pixels 290 are manufactured along both the top edge 292 of the right display device 134 and along the right edge 296 of the right display device 134. The reserve pixels 290 are thus available to compensate for either or both of the vertical and the horizontal misalignment 210 between the displays 133 and 134 (as above explained). Moreover, as FIG. 15 further illustrates, the reserve pixels 290 may also compensate for any rotational misalignment 210 (such as the angle θ illustrated as reference numeral 222). The excess reserve pixels 290 are thus available for the up/down, left/right, and rotational compensation 258.

Figure 16:
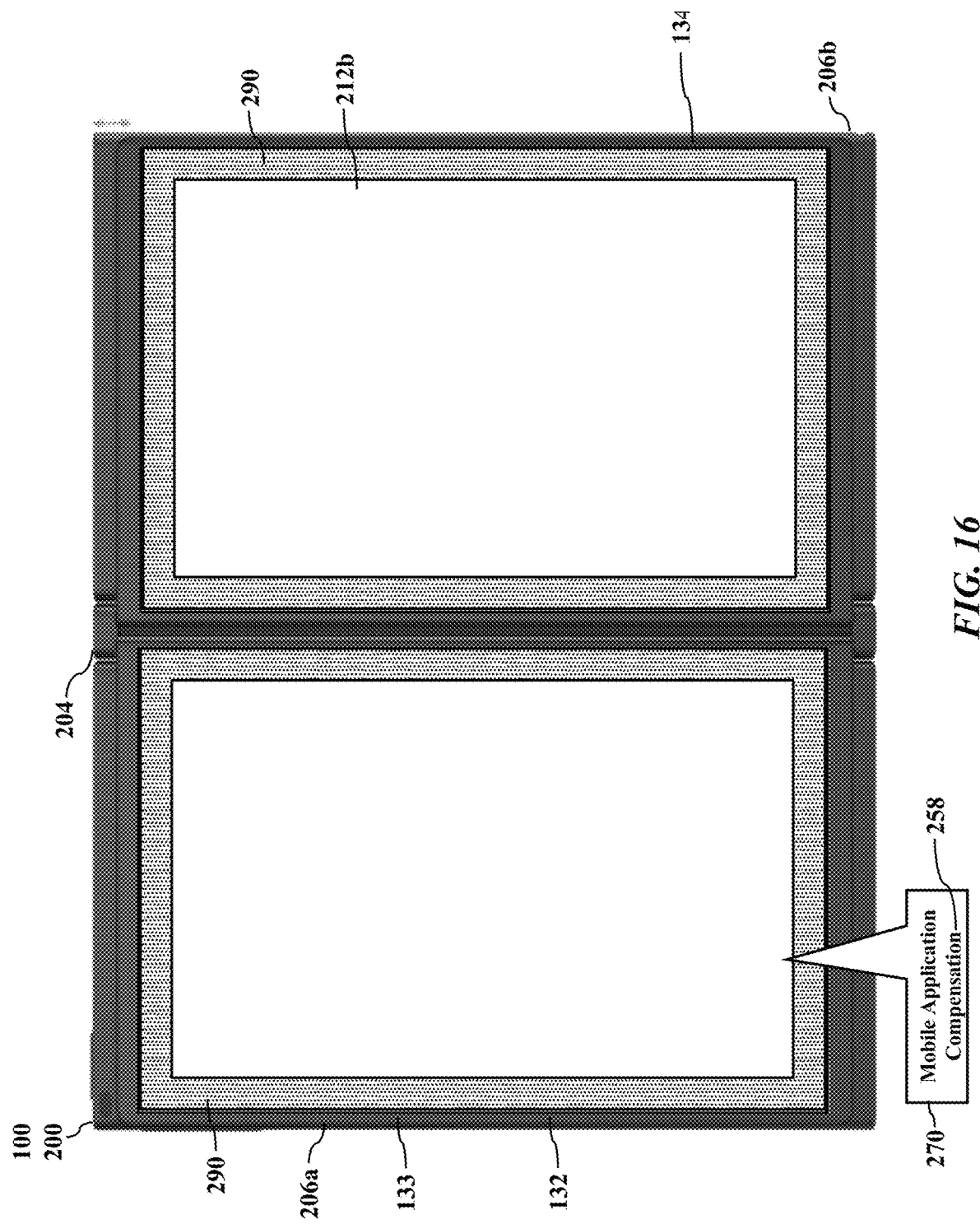

FIG. 16 illustrates perimeter banding. The additional reserve pixels 290 may be manufactured along any or all edges (such as top, bottom, left, and right) of either or both of the displays 133 and 134. The reserve pixels 290 may thus frame either or both of the displays 133 and 134. Any of the reserve pixels 290 may thus be individually activated to correct any misalignment (vertical, horizontal, and/or rotational) between the displays 133 and 134. There may be any number, count, and/or resolution of the reserve pixels 290, perhaps only limited by additional size and/or cost constrains. Indeed, a maximum stack or summation of tolerances in the hinge 204 and/or the housings 206a and 206b may determine the number and location (such as top, bottom, left, and/or right) of the reserve pixels 290.

Figure 17:
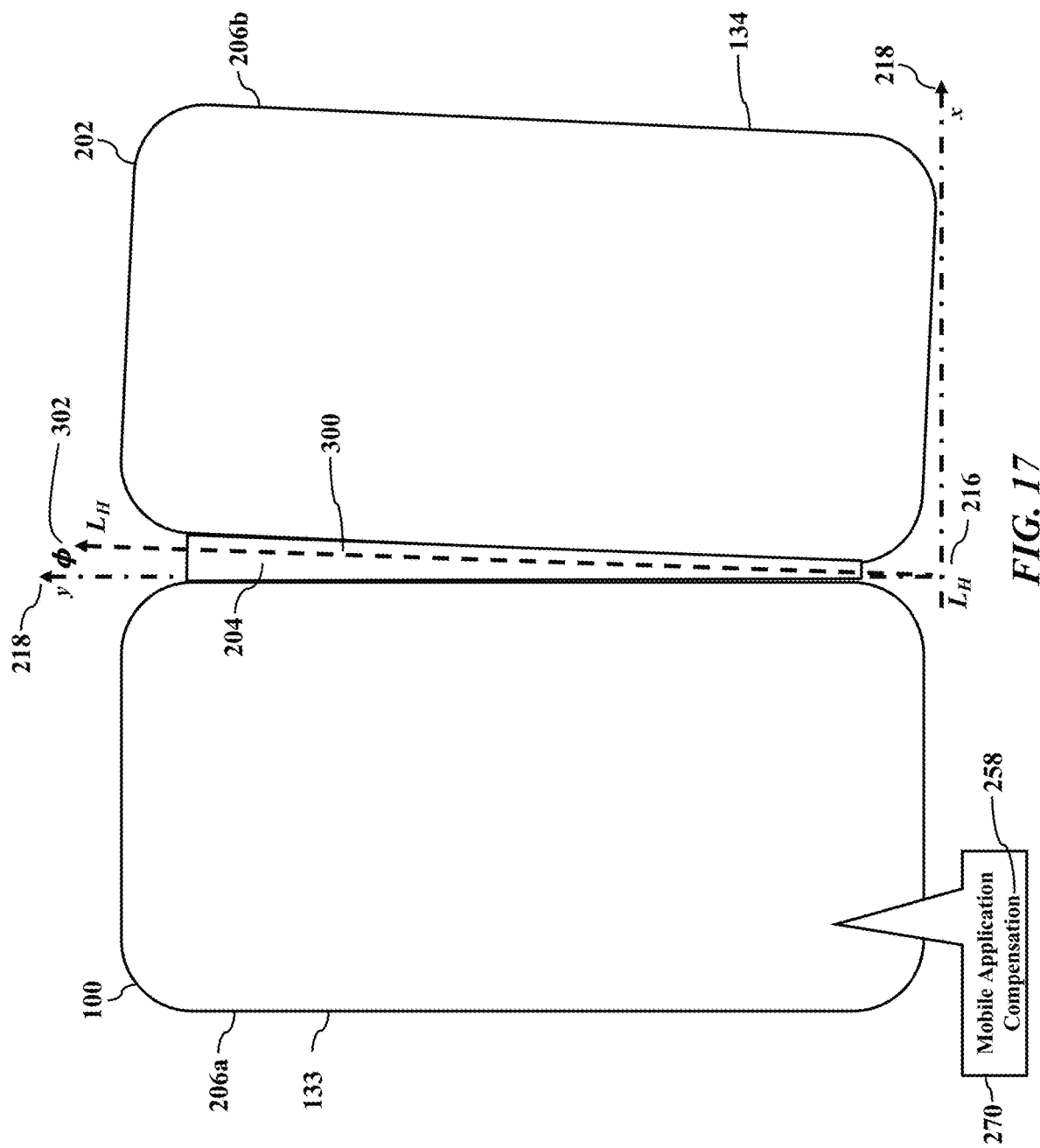
FIG. 17 illustrates a mechanical alignment, according to exemplary embodiments.

FIG. 17 illustrates a mechanical alignment, according to exemplary embodiments. Because the leaves of the hinge 204 interconnect the housings 206a and 206b, the hinge 204 itself may contribute to the misalignment 210 between the two displays 133 and 134. The hinge 204, in other words, has a longitudinal axis $L_H$-$L_H$ (illustrated as reference numeral 300) that may have an angular offset Φ (illustrated as reference numeral 302) with respect to the origin 216 of the x-y Cartesian coordinate system 218).

The angular offset Φ 302 may an additional factor. Once the angular offset Φ 302 is known, the angular offset Φ 302 may be provided as an additional input to the compensation application 250 (executed by the server 248, as FIGS. 8-10 explained). The angular offset Φ 302, for example, may be determined by a jig or tool having angular optic/sensors/transducers that measure or infer the angular offset Φ 302. The jig or tool may then send the angular offset Φ 302 to the server 248 (perhaps via the communications network 246) for additional analysis. The compensation application 250 may then use the digital image(s) 212 and the angular offset Φ 302 to determine the pixel discrepancy or difference 254 and its corresponding compensation 258 (again, as explained with reference to FIGS. 8-10). The angular offset Φ 302 may thus be an additional calibration input to help compensate for the misalignment 210 between the displays 133 and 134.

Exemplary embodiments thus present a factory/service calibration and software solution. Exemplary embodiments may be rendered across first and second displays 133 and 134 to determine whether there is acceptable alignment across all pixels of first and second displays 133 and 134. The first and second displays 133 and 134 may be commanded to generate vertical and horizontal grid lines, perhaps displayed across the first and second displays 133 and 134, and detect or infer any unacceptable pixel misalignment.

Image analysis may be used to infer the misalignment 210. Recall that the digital image(s) 212 may be compared to themselves and/or compared to the reference image 252 to infer the misalignment 210 and its corresponding compensation 258 (as above explained with reference to FIGS. 8-10). The compensation application 250 may use, or call, or interface with any imaging software application or technique to compare the digital image(s) 212 and/or the reference image 252.

Figure 18:
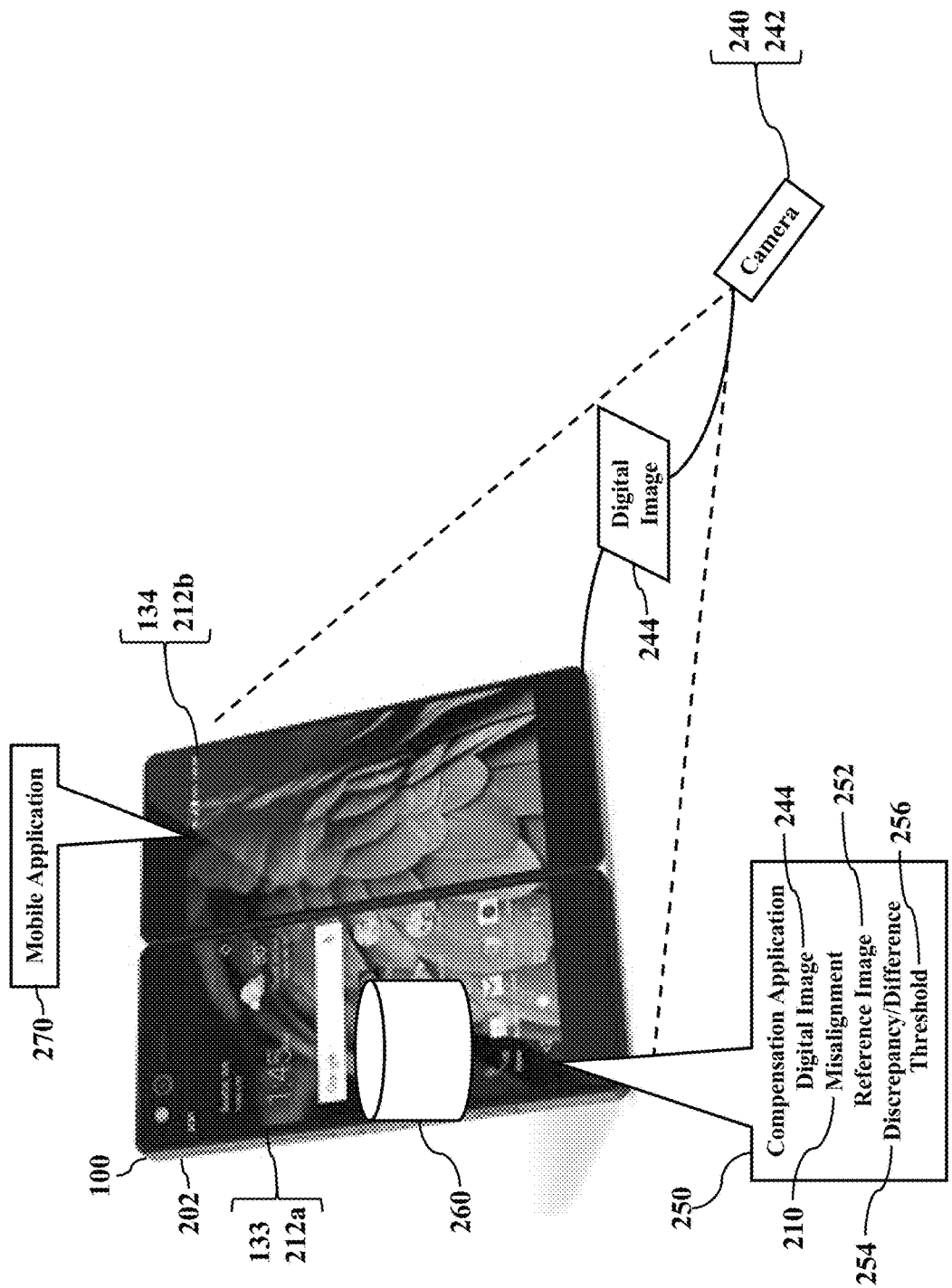
FIG. 18 illustrates a local compensation, according to exemplary embodiments.

FIG. 18 illustrates a local compensation, according to exemplary embodiments. The information handling system 100 (illustrated as the mobile smartphone 202) may itself infer the misalignment 210 and the compensation 210. The mobile smartphone 202 may locally store and execute the compensation application 250 and the mobile application 270. The mobile smartphone 202 may also interface with the vision system 240 (perhaps via the communications network 246, as illustrated with reference to FIGS. 8-10). The compensation application 250 and/or the mobile application 270 cooperate to cause the mobile smartphone 202 to display the images 212a and 212b via the displays 133 and 134. The camera 242 captures the digital image 244 representing one, or both, of the images 212a and 212b respectively displayed by the displays 133 and 134. The camera 242 sends the digital image 244 via the communications network 246 to the mobile smartphone 202 for analysis. The compensation application 250 and/or the mobile application 270 cooperate to cause the mobile smartphone 202 to inspect the digital image 244 and/or to compare to the reference image 252. The compensation application 250 and/or the mobile application 270 cooperate to cause the mobile smartphone 202 to determine the pixel discrepancy or difference 254, to compare to the threshold difference 256, and to determine the compensation 258. While the mobile smartphone 202 may locally store the compensation database 260, the mobile smartphone 202 may alternatively query a network node (such as the server 248 illustrated in FIGS. 8-10) to obtain or retrieve the compensation 258. Once the compensation 258 is known, the mobile smartphone 202 implements the compensation 258 as a correction for the misalignment 210 between the displays 133 and 134. The mobile smartphone 202 may thus vertically, horizontally, and/or rotationally shift either of both of the images 212a and 212b to visually align the displays 133 and 134.

Figure 19:
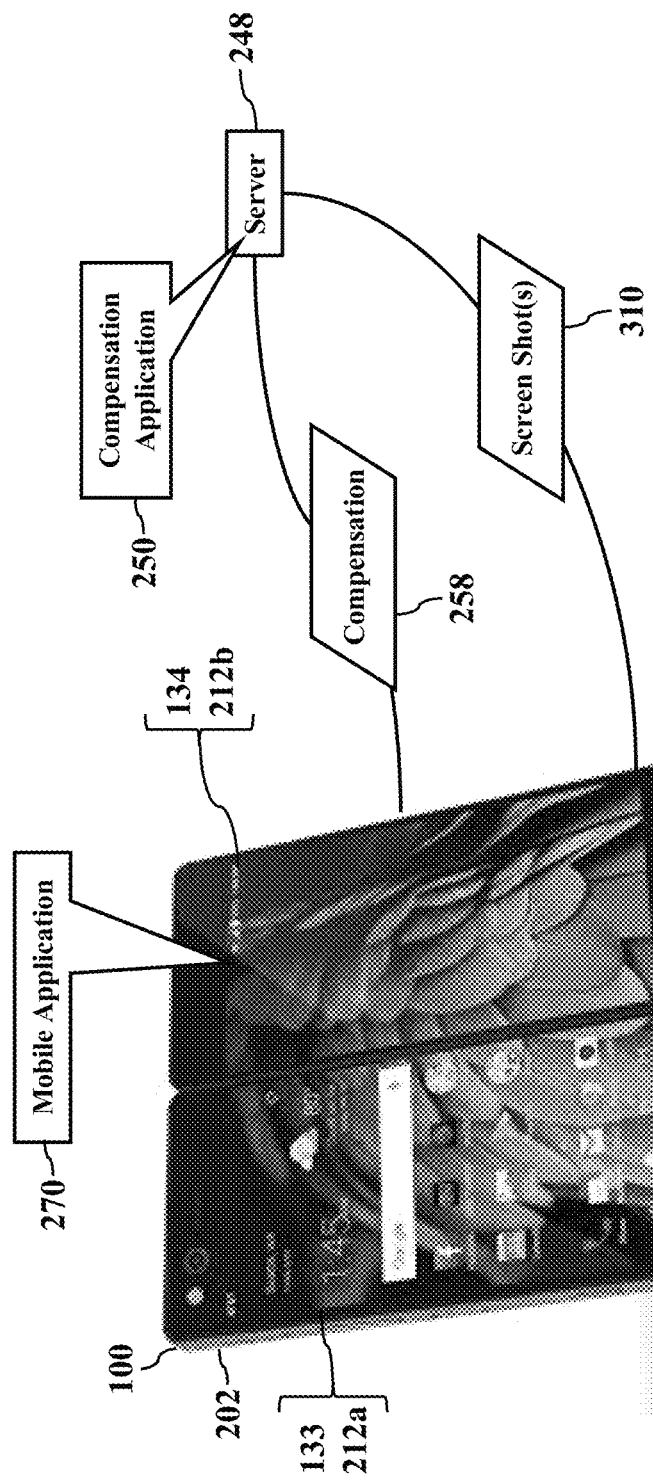
FIG. 19 illustrates screen shots, according to exemplary embodiments.

FIG. 19 illustrates screen shots 310, according to exemplary embodiments. Here the information handling system 100 (again illustrated as the mobile smartphone 202) may itself capture the digital images 244 representing one, or both, of the images 212a and 212b respectively displayed by the displays 133 and 134. The mobile smartphone 202 may generate the so-called screen shots 310 of the displays 133 and 134. The screen shots 310 may thus be informationally and functionally/operationally equivalent to the images 212 above discussed. The mobile smartphone 202 may then send the screen shots 310 (via the communications network 246) to the server 248 for analysis (as above explained). Returning to FIGS. 9-10, the server 248 compares the screen shots 310 to themselves and/or to the reference image 252 to determine the pixel discrepancy or difference 254 and its corresponding compensation 258 (as above explained). The server 248 sends the compensation 258 to the mobile smartphone 202 for implementation by the graphics processor 132 (as above explained).

Cloud-based services may thus be provided. The information handling system 100 may interface with the server 248 to determine the compensation 258. The server 248 may thus offer an alignment service provided by a cloud service provider. The information handling system 100, and/or the mobile application 270, may outsource or subcontract an alignment operation to the cloud service provider. The information handling system 100, for example, may generate and send a service request via the communications network 246 to the network address (such as an Internet protocol address) associated with the server 248. The service request may include or specify the images 212 and/or the screen shots 310. The service request may include or specify any data details associated with the information handling system 100 (such as manufacturer, model, age, date). The server 248 acts on information in the images 212 and/or the screen shots 310 and/or the service request, determines the compensation 258, and generates a service response. The service response may simply or comprehensively detail the compensation 258 that aligns the images 212 and/or the screen shots 310. The service response is sent via the communications network 246 to the network address (such as an Internet protocol address) associated with the information handling system 100 for implementation by the graphics processor 132 (as above explained).

The information handling system 100 and the server 248 may thus cooperate in a client/server fashion and cooperate to send, receive, and/or generate the service request, the service response, and/or the compensation 258. A fee (such as payable via credit card, account debit, or cryptographic fee) may then be charged, assessed, or debited.

Figure 20:
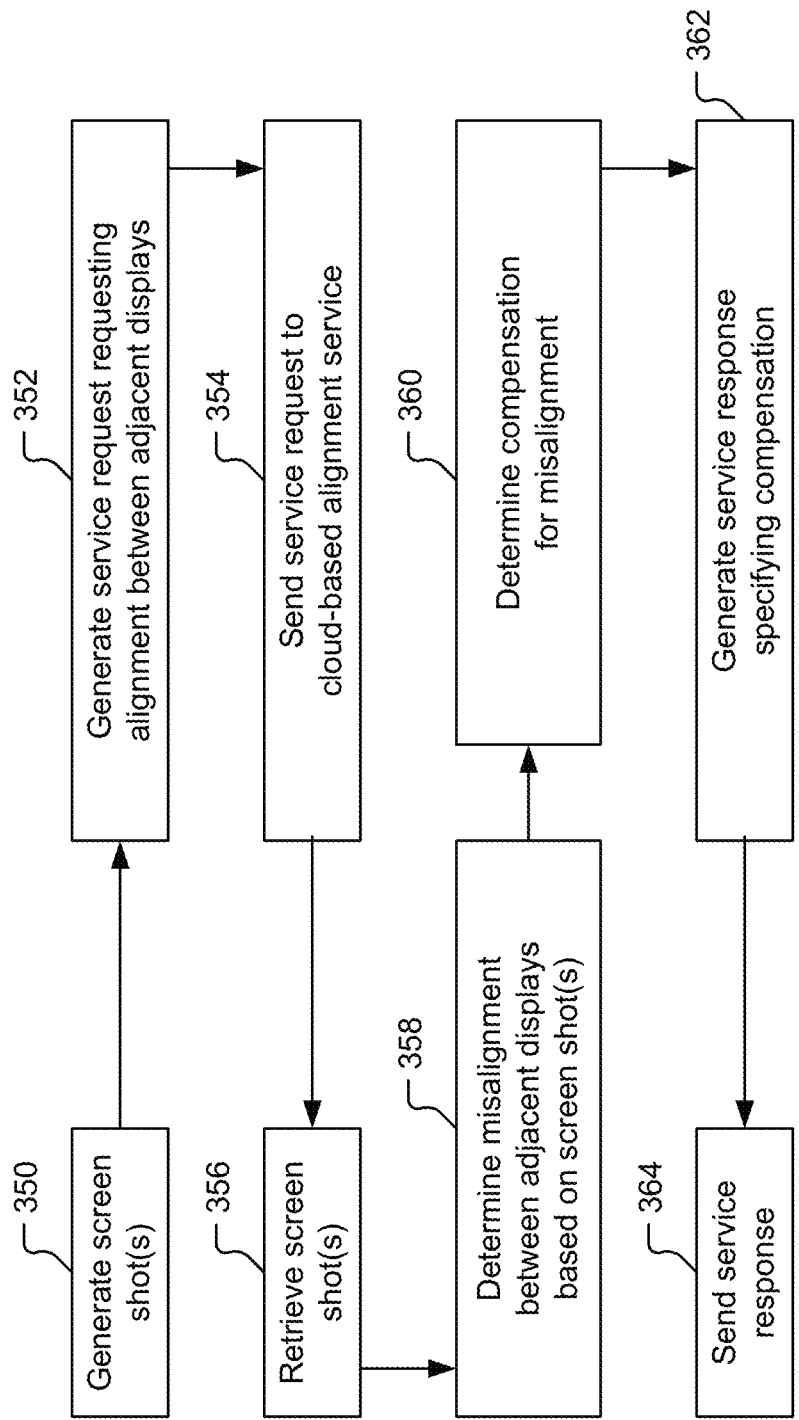
FIG. 20 is a flowchart illustrating a method or algorithm for aligning adjacent displays.

FIG. 20 is a flowchart illustrating a method or algorithm for aligning adjacent displays. The information handling system 100 generates the screen shots 310 (Block 350) having data representing the images 212 displayed by the first display device 133 and the second display device 134. The information handling system 100 generates the service request requesting an alignment between the adjacent displays 133 and 134 (Block 352). The information handling system 100 sends the service request to the server 248 operated on behalf of the cloud service provider (Block 354). The server 248, providing the cloud-based alignment service, retrieves the screen shots 310 (Block 356) and determines the misalignment 210 between the first display device 133 and the second display device 134 based on the screen shots 310 (Block 358). The cloud-based alignment service determines the compensation 258 for the misalignment 210 (Block 360) and generates the service response that specifies the compensation (Block 362). The cloud-based alignment service sends the service response (Block 364). While the service response may be sent to any network destination, the service response may be sent to the information handling system 100 requesting the cloud-based alignment service.

The factory calibration and software solution may include the template that is used for the calibration of the adjacent displays. The template is used to determine the pixel misalignment that can be caused a longitudinal/rotational offset of pixels of the adjacent displays. The measurements can be stored as error factors and a history capture in a memory within the first display, the second display, both. The measurements can also be stored in a memory within the hinged information handling system that is external to the adjacent displays. During the calibration of the hinged information handling system, the measurements and the history capture can be read from any of the memories by the processor to perform the calibration based on the determined longitudinal and or rotational offsets. Any longitudinal/rotational readjustment(s) can reduce a loss of overall pixels caused by the pixel misalignment. The calibration can thereby restore or substantially restore the pixel wide alignment of the adjacent displays.

The template used for the calibration can be used in a system that includes one or more image capture devices. The system can be a part of an autonomous environment that can be implemented at the point of manufacture of the hinged information handling system. The processor can receive information that is associated with an angle of a hinge of the hinged information handling system. The processor can be in communication with the image capture devices. The image capture devices can capture image data from one or both displays based on the information. The longitudinal and rotational offsets can be determined via the template. The image capture devices can send the image data to the processor. The processor can cause the calibration or the readjustment of one or both of the adjacent displays to restore or substantially restore the pixel wide alignment of the adjacent displays based on the image data. There can be an overall loss of pixels to a tune of half of an error factor on either display as a consequence of the calibration.

The factory calibration and software solution includes a larger than standard panel and mask in the calibration to remove or substantially remove the consequential loss of pixels due to the calibration or correction. The larger than standard panel and mask can be denser than an industry standard panel and mask so that offset pixels can be available to adjust the pixel misalignment during the calibration. The larger than standard panel and mask can thereby include a predetermined number of pixels offset for the calibration. The larger than standard panel and mask can be a full high definition (FHD) panel of 1930×1090 panel mask whereas the industry standard can be a FHD 1920×1080 panel mask. The larger than standard panel and mask can thereby afford as much as ten pixels offset for the calibration to align the single image across the adjacent displays. A value of a pixel offset can be a predetermined amount, a dynamic amount based on a product type and/or size, or the like.

First and second displays 133 and 134 can include first and second pixel arrays. The first pixel array can correspond to a first 1920×1080 panel or a first 1930×1090 mask. The second pixel array can correspond to a second 1920×1080 panel or a second 1930×1090 mask. The first and second pixel arrays can be based on the type and size of the panels within the assembly stack at the point of manufacture. The first and second pixel arrays can thereby be used to select the template that is used during the calibration. The template can include a first grid that is associated with the first pixel array of the first display. The template can include a second grid that is associated with the second pixel array of the second display. The template can include horizontal and/or vertical lines that are matched to the bit lines and word lines of the first and second pixel arrays. The template can include a single horizontal line that is matched to the word line located at the distance D from an edge of a pixel array.

The template may be rendered across one or both of the first and second displays 133 and 134 of the hinged information handling system 100 during the calibration of the pixel misalignment. The template may include a plurality of pixels that are sequentially numbered to aid explanation such as pixels 0, 1, 2, 3 . . . 30, 31, and 32. First pixel array can include a first portion of the pixels and second pixel array can include a second portion of the pixels. First pixel array and second pixel array each can be associated with the X and Y axes of the two dimensional coordinate space 218. First pixel array can be separated from second pixel array by a physical gap along a bold vertical black bar between first and second pixel arrays. The bold vertical black bar can be associated with the physical gap is defined by the hinge of the hinged information handling system that is not shown here. An edge can be oriented at a first location equal to or substantially equal to a first edge of a first bezel of the first display of the hinged information handling system that is not shown here. Edge can be oriented at a second location equal to or substantially equal to a second edge of a second bezel of the second display of the hinged information handling system that is not shown here.

Exemplary embodiments may be a part of the factory calibration and software solution at the point of manufacture or at the service repair of the hinged information handling system. The service repair can occur during the lifetime use of the hinged information handling system. Exemplary embodiments may occur within the autonomous system that includes the image capture devices. The image capture devices can capture image data corresponding to the pixel misalignment based on information associated with the angle of the hinge, the template, and/or the first and second displays. The error measurement can be determined based on the image data that is sent by the one or more image capture devices to the processor. Exemplary embodiments may occur during the service repair whereby a service technician can select the template that is used during the calibration to determine the pixel misalignment. In response to the manual selection of the template, the processor can determine the unit specific error and history capture that correspond to the magnitude value of the longitudinal and/or rotational adjustment. The determined unit specific error and history capture store are stored into the memory. The compensation 258 may be read from the memory and used in a recalibration of the hinged information handling system.

Exemplary embodiments may be applied regardless of networking environment. Exemplary embodiments may be easily adapted to stationary or mobile devices having cellular, wireless local area networking capability (such as WI-FI®), near field, and/or BLUETOOTH® capability. Exemplary embodiments may be applied to mobile devices utilizing any portion of the electromagnetic spectrum and any signaling standard (such as the radio spectrum and IEEE 802 family of standards, GSM/CDMA/TDMA or any cellular standard, and/or the ISM band). Exemplary embodiments, however, may be applied to any processor-controlled device operating in the radio-frequency domain and/or the Internet Protocol (IP) domain. Exemplary embodiments may be applied to any processor-controlled device utilizing a distributed computing network, such as the Internet (sometimes alternatively known as the "World Wide Web"), an intranet, a local-area network (LAN), and/or a wide-area network (WAN). Exemplary embodiments may be applied to any processor-controlled device utilizing power line technologies, in which signals are communicated via electrical wiring. Indeed, exemplary embodiments may be applied regardless of physical componentry, physical configuration, or communications standard(s).

Exemplary embodiments may utilize any processing component, configuration, or system. Any processor could be multiple processors, which could include distributed processors or parallel processors in a single machine or multiple machines. The processor can be used in supporting a virtual processing environment. The processor could include a state machine, application specific integrated circuit (ASIC), programmable gate array (PGA) including a Field PGA, or state machine. When any of the processors execute instructions to perform "operations," this could include the processor performing the operations directly and/or facilitating, directing, or cooperating with another device or component to perform the operations.

Exemplary embodiments may packetize. When any device or server communicates via the communications network 246, the device or server may collect, send, and retrieve information. The information may be formatted or generated as packets of data according to a packet protocol (such as the Internet Protocol). The packets of data contain bits or bytes of data describing the contents, or payload, of a message. A header of each packet of data may contain routing information identifying an origination address and/or a destination address.

The various embodiments of the present disclosure discussed above may provide a technological improvement for the information handling system. The system and techniques described above may provide for a significant technological improvement over conventional methods of graphic display of visual outputs that can be rendered across dual displays of the information handling system. The system and methods described herein therefore provide a technological improvement that amounts to significantly more than a "display persistence" of conventional systems.

In accordance with various embodiments of the present disclosure, the methods described herein can be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions can be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein. In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives can be considered a distribution medium that is equivalent to a tangible storage medium. Accordingly, the disclosure is considered to include any one or more of a computer-readable medium or a distribution medium and other equivalents and successor media, in which data or instructions can be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
a first display and a second display connected by a hinge;
a processor; and
a memory storing instructions that when executed cause the processor to perform operations, the operations including:
rendering a first image on the first display;
rendering a second image on the second display;
receiving data representing a rotational misalignment between the first display and the second display; and
implementing the data to compensate for the rotational misalignment between the first display and the second display by activating reserve pixels along an edge of the first display or the second display, wherein the reserve pixels are inactive prior to the receiving data representing the rotational misalignment.

2. The information handling system of claim 1, wherein the operations further include vertically shifting the second image to compensate for a misalignment.

3. The information handling system of claim 1, wherein the operations further include horizontally shifting the second image to compensate for a misalignment.

4. The information handling system of claim 1, wherein the operations further include rotating the second image to compensate for the rotational misalignment.

5. The information handling system of claim 1, wherein the operations further include vertically shifting at least one of the first image and the second image to compensate for a misalignment.

6. The information handling system of claim 1, wherein the operations further include horizontally shifting at least one of the first image and the second image to compensate for a misalignment.

7. The information handling system of claim 1, wherein the operations further include rotating at least one of the first image and the second image to compensate for the rotational misalignment.

8. A method comprising:
rendering a first image on a first display;
rendering a second image on a second display;
receiving data representing a rotational misalignment between the first display and the second display; and
implementing the data to compensate for the rotational misalignment between the first display and the second display by activating reserve pixels along an edge of the first display or the second display, wherein the reserve pixels are inactive prior to the receiving data representing the rotational misalignment.

9. The method of claim 8, further comprising vertically shifting the second image to compensate for a misalignment.

10. The method of claim 8, further comprising horizontally shifting the second image to compensate for a misalignment.

11. The method of claim 8, further comprising rotating the second image to compensate for the rotational misalignment.

12. The method of claim 8, further comprising vertically shifting at least one of the first image and the second image to compensate for a misalignment.

13. The method of claim 8, further comprising rotating at least one of the first image and the second image to compensate for the rotational misalignment.

14. A non-transitory computer-readable medium to store instructions that are executable to perform operations comprising:
rendering a first image on a first display;
rendering a second image on a second display;
receiving data representing a rotational misalignment between the first display and the second display; and
implementing the data to compensate for the rotational misalignment between the first display and the second display by activating reserve pixels along an edge of the first display or the second display, wherein the reserve pixels are inactive prior to the receiving data representing the rotational misalignment.

15. The non-transitory computer-readable medium of 14, wherein the operations further include vertically shifting the second image to compensate for a misalignment.

16. The non-transitory computer-readable medium of 14, wherein the operations further include horizontally shifting the second image to compensate for a misalignment.

17. The non-transitory computer-readable medium of 14, wherein the operations further include rotating the second image to compensate for the rotational misalignment.

18. The non-transitory computer-readable medium of 14, wherein the operations further include vertically shifting at least one of the first image and the second image to compensate for a misalignment.

19. The non-transitory computer-readable medium of 14, wherein the operations further include horizontally shifting at least one of the first image and the second image to compensate for the rotational misalignment.

20. The non-transitory computer-readable medium of 14, wherein the reserve pixels may be activated to correct the rotational misalignment.

* * * * *